US009312283B2

(12) United States Patent
Nanai et al.

(10) Patent No.: US 9,312,283 B2
(45) Date of Patent: *Apr. 12, 2016

(54) METHOD FOR PRODUCING DISPLAY PANEL, AND DISPLAY PANEL

(71) Applicant: JOLED INC., Tokyo (JP)

(72) Inventors: Norishige Nanai, Osaka (JP); Takaaki Ukeda, Osaka (JP); Akihito Miyamoto, Osaka (JP)

(73) Assignee: JOLED INC., Tokyo (JP)

( * ) Notice: Subject to any disclaimer, the term of this patent is extended or adjusted under 35 U.S.C. 154(b) by 51 days.

This patent is subject to a terminal disclaimer.

(21) Appl. No.: 14/217,817

(22) Filed: Mar. 18, 2014

(65) Prior Publication Data

US 2014/0197417 A1 Jul. 17, 2014

Related U.S. Application Data

(63) Continuation of application No. PCT/JP2012/005468, filed on Aug. 30, 2012.

(30) Foreign Application Priority Data

Nov. 16, 2011 (JP) ................................. 2011-250822

(51) Int. Cl.
*H01L 27/12* (2006.01)
*H01L 27/32* (2006.01)

(52) U.S. Cl.
CPC .......... *H01L 27/124* (2013.01); *H01L 27/1248* (2013.01); *H01L 27/1259* (2013.01); *H01L 27/1292* (2013.01); *H01L 27/3246* (2013.01); *H01L 27/3248* (2013.01); *H01L 27/3258* (2013.01); *H01L 2227/323* (2013.01)

(58) Field of Classification Search
CPC ............ H01L 27/3246; H01L 27/3262; H01L 27/3265; H01L 27/3248; H01L 27/124
See application file for complete search history.

(56) References Cited

U.S. PATENT DOCUMENTS 8,524,328 B2    9/2013  Takeuchi
9,190,430 B2 *  11/2015 Nanai ................. H01L 27/3246
(Continued)

FOREIGN PATENT DOCUMENTS

EP          2346020          7/2011
JP       2007-305357        11/2007
(Continued)

OTHER PUBLICATIONS

International Search Report (ISR) in International Patent Application No. PCT/JP2012/005468, dated Dec. 4, 2012.

*Primary Examiner* — Jose R Diaz
(74) *Attorney, Agent, or Firm* — Greenblum & Bernstein, P.L.C.

(57) ABSTRACT

In a method for producing a display panel, a base substrate having an upper surface on which an electrode is located is prepared. A first layer having a first opening overlapping with the electrode in plan-view is formed on the base substrate. A second layer having a second opening overlapping with the first opening in plan-view is formed on the first layer. The second opening has a smaller area than the first opening in plan-view. A wiring layer is formed in the first opening and the second opening, in contact with the electrode. The second layer includes a portion located on an upper surface of the first layer and a portion located in the first opening. The portion of the second layer located in the first opening covers an internal side surface of the first layer located around the first opening.

20 Claims, 22 Drawing Sheets

(56) References Cited

U.S. PATENT DOCUMENTS

| | | | |
|---|---|---|---|
| 2007/0263164 A1 | 11/2007 | Kumagai | |
| 2008/0150434 A1* | 6/2008 | Sung et al. | 315/169.3 |
| 2009/0027579 A1 | 1/2009 | Aota et al. | |
| 2010/0090933 A1 | 4/2010 | Kumagai | |
| 2010/0271353 A1 | 10/2010 | Yoneya | |
| 2011/0012097 A1 | 1/2011 | Yoneya | |
| 2011/0031492 A1 | 2/2011 | Yamazaki et al. | |
| 2011/0199564 A1 | 8/2011 | Moriwaki | |
| 2012/0007092 A1 | 1/2012 | Yamada | |
| 2013/0187177 A1* | 7/2013 | Nanai et al. | 257/88 |
| 2014/0091303 A1 | 4/2014 | Yamazaki et al. | |
| 2014/0092354 A1 | 4/2014 | Moriwaki | |

FOREIGN PATENT DOCUMENTS

| | | |
|---|---|---|
| JP | 2008-277370 | 11/2008 |
| JP | 2009-031468 | 2/2009 |
| JP | 2009-224542 | 10/2009 |
| JP | 2010-002675 | 1/2010 |
| JP | 2010-079225 | 4/2010 |
| JP | 2010-258118 | 11/2010 |
| JP | 2011-054949 | 3/2011 |
| WO | 2010/038514 | 4/2010 |
| WO | 2010/104005 | 9/2010 |

* cited by examiner

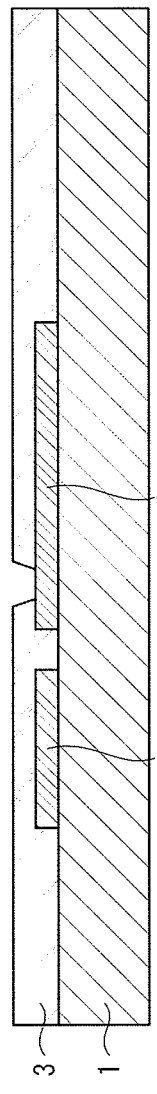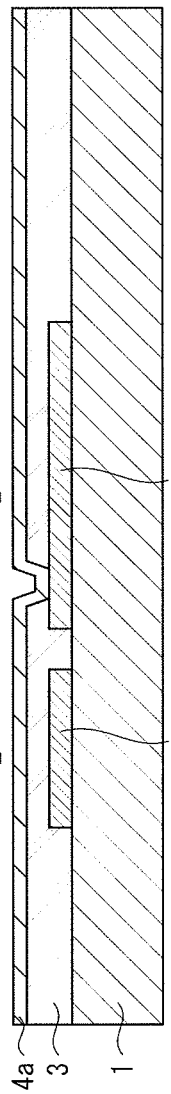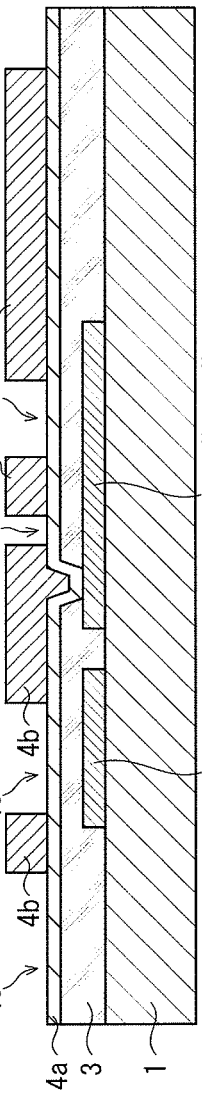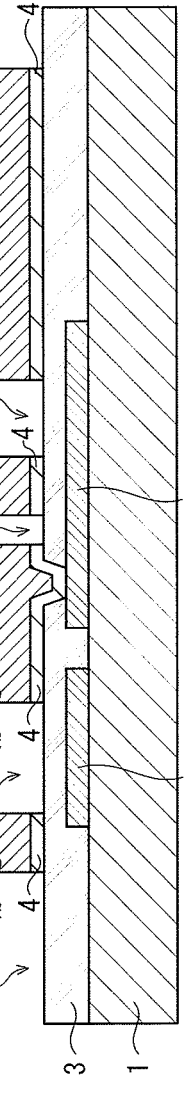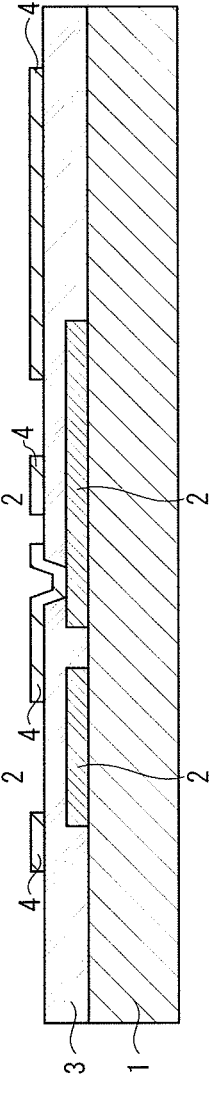

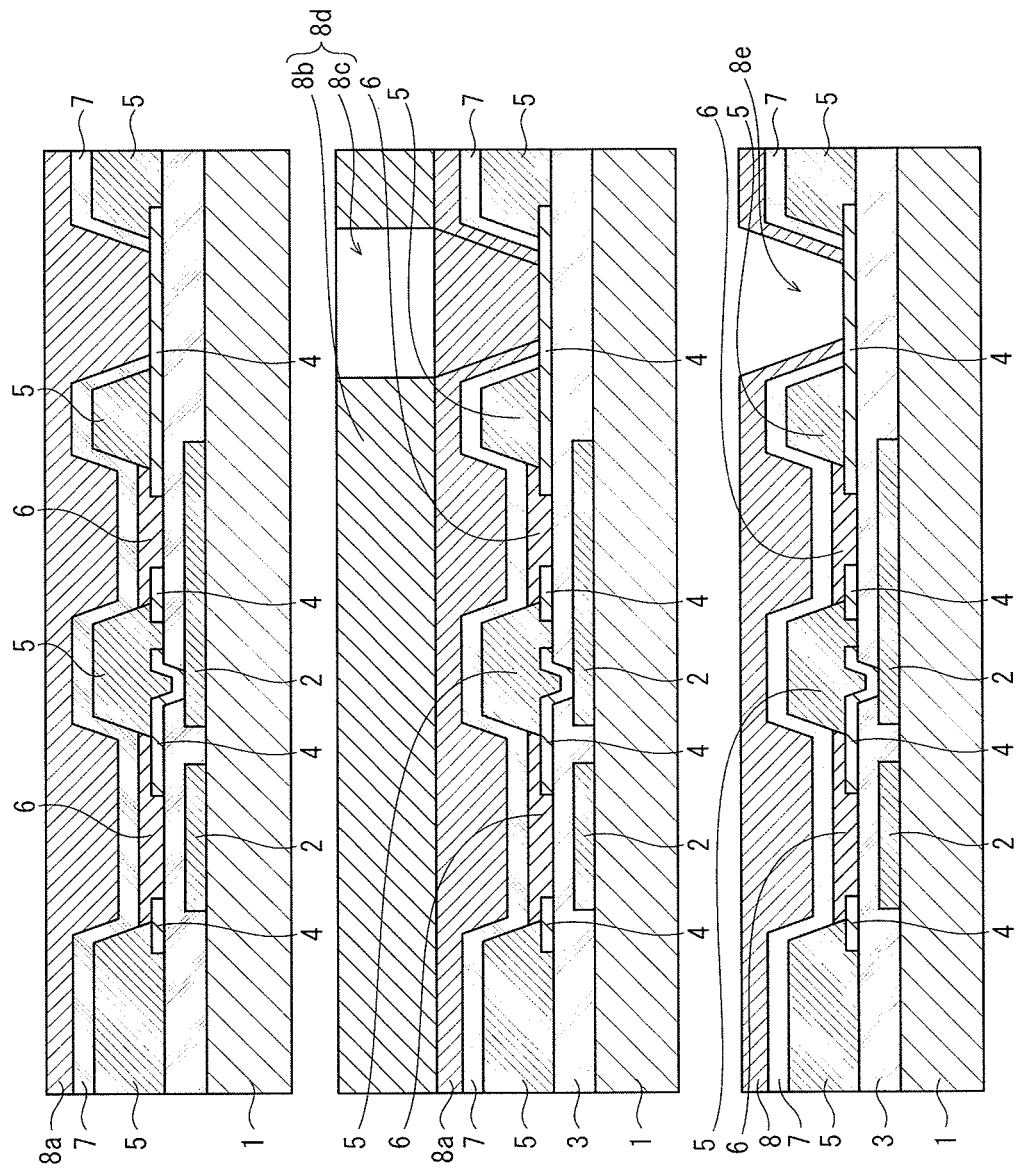

METHOD FOR PRODUCING DISPLAY PANEL, AND DISPLAY PANEL

CROSS REFERENCE TO RELATED APPLICATION

This is a continuation application of PCT Application No. PCT/JP2012/005468 filed Aug. 30, 2012, designating the United States of America, the disclosure of which, including the specification, drawings and claims, is incorporated herein by reference in its entirety

TECHNICAL FIELD

The present disclosure relates to a method for producing a display panel such as an organic electroluminescence (EL) display panel, and in particular relates to an art of forming contact holes.

BACKGROUND ART

In recent years, an active matrix type organic EL display panel has been developed which includes drive circuits that drive a light-emitting element for each of a plurality of pixels (for example, refer to Patent Literature 1).

FIG. 22 is a cross-sectional diagram illustrating structure of an organic EL display panel disclosed in Patent Literature 1. Note that the structure illustrated in FIG. 22 is for two pixels. The organic EL display panel includes a substrate 51, gate electrodes 52, a gate insulating film 53, source and drain electrodes (hereinafter, referred to as S-D electrodes) 54, semiconductor layer portions 56, a passivation film 57, a planarizing film 58, pixel electrodes 59, banks 60, organic EL layer portions 61, a common electrode 62, a resin sealing layer 63, a sealing substrate 64, and metal contacts 65. The gate electrodes 52, the gate insulating film 53, the S-D electrodes 54, and the semiconductor layer portions 56 compose transistors configuring each of the drive circuits. The passivation film 57 and the planarizing film 58 cover the transistors. The pixel electrodes 59, the organic EL layer portions 61, and the common electrode 62 compose the light-emitting elements. The light-emitting elements are formed on the planarizing film 58. A plurality of contact holes are formed through the passivation film 57 and the planarizing film 58. The pixel electrodes 59 of the light-emitting elements are electrically connected to the S-D electrodes 54 of the drive circuits through the metal contacts 65, which are formed in the contact holes. With regards to process order during formation of the contact holes, Patent Literature 1 recites that the passivation film 57 is formed from silicon nitride, the planarizing film 58 is subsequently formed from an organic material, and thereafter etching is performed on both the planarizing film 58 and the passivation film 57 (paragraph 0048).

CITATION LIST

Patent Literature

Patent Literature 1: Japanese Patent Application Publication No. 2007-305357

SUMMARY

Technical Problem

The art disclosed in Patent Literature 1 is an art in which a first layer is formed, a second layer is subsequently formed on the first layer, and thereafter etching is performed in a single process on both the first layer and the second layer in order to form openings therein, which are to be used as contact holes. Consequently, at a stage during production at which the contact holes have been formed, both the first layer and the second layer are exposed at an internal side surface thereof located around the contact hole. Therefore, a problem of degradation of the first layer may occur if the first layer is made of a material that has a low tolerance against a gas or liquid chemical used during a process step after formation of the second layer. For example, the problem described above may occur when the first layer is made of a material that has a low tolerance against a gas or liquid chemical used during a process step of forming the metal contacts. Also, if a pin-hole arises in any of the metal contacts, a gas or liquid chemical used in a process step after formation of the metal contacts may also be able to penetrate to the first layer through the pin-hole. Therefore, the same problem as described above may occur when the first layer is made of a material that has a low tolerance against the gas or liquid chemical which penetrates to the first layer through the pin-hole.

In consideration of the above problem, the present disclosure aims to provide an art which can restrict degradation of the first layer, even when openings are formed in the first layer and the second layer in order to form a contact hole.

Solution to Problem

A method for producing a display panel relating to one aspect of the present disclosure comprises: preparing a base substrate having an upper surface on which an electrode is located; forming a first layer on the base substrate such that the first layer has a first opening therein at a position overlapping with the electrode in plan-view; forming a second layer on the first layer such that the second layer has a second opening therein at a position overlapping with the first opening in plan-view, the second opening having a smaller area than the first opening in plan-view; and forming a wiring layer in the first opening and the second opening such that the wiring layer is in contact with the electrode, wherein the second layer includes a portion located on an upper surface of the first layer and a portion located in the first opening, and the portion of the second layer located in the first opening covers an internal side surface of the first layer located around the first opening.

Advantageous Effects

Through the above configuration, the internal side surface of the first layer, which is located around the first opening, is covered by the portion of the second layer located in the first opening. Consequently, the first layer is not directly exposed to a gas or liquid chemical used in a process step after formation of the second layer. Therefore, when openings are formed in the first layer and the second layer in order to form a contact hole, degradation of the first layer can be restricted even if the first layer is made of a material that has a low tolerance against the aforementioned gas or liquid chemical.

BRIEF DESCRIPTION OF DRAWINGS

FIGS. 2A-2E are cross-sectional diagrams for explaining a production process of the display panel illustrated in FIG. 1.

FIGS. 6A-6C are cross-sectional diagrams for explaining the production process of the display panel illustrated in FIG. 1.

DESCRIPTION OF EMBODIMENTS

Figure 1:
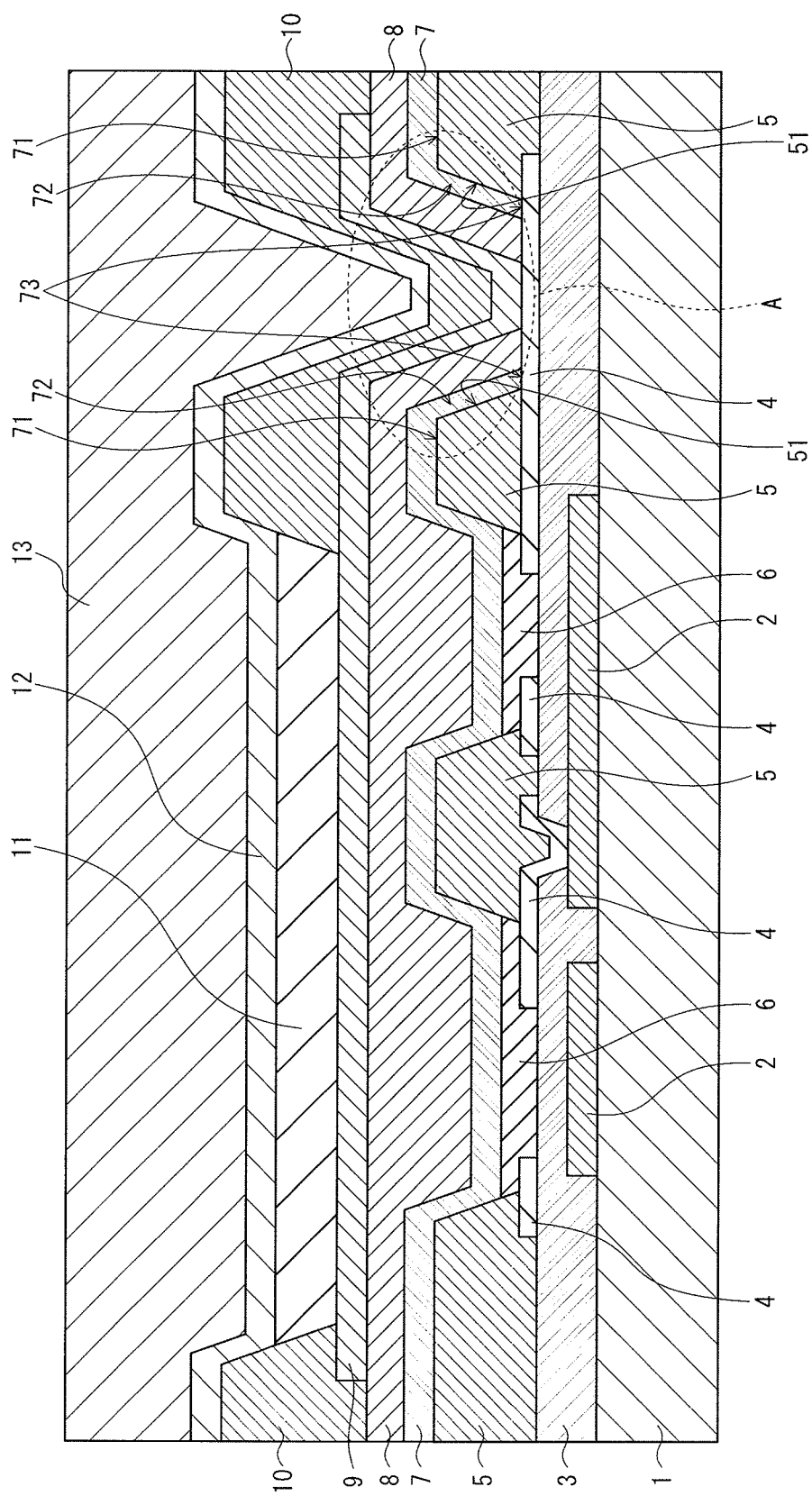
FIG. 1 is a cross-sectional diagram illustrating structure of a display panel relating to a first embodiment of the present disclosure.

[Outline of One Aspect of Present Disclosure]

A method for producing a display panel relating to one aspect of the present disclosure comprises: preparing a base substrate having an upper surface on which an electrode is located; forming a first layer on the base substrate such that the first layer has a first opening therein at a position overlapping with the electrode in plan-view; forming a second layer on the first layer such that the second layer has a second opening therein at a position overlapping with the first opening in plan-view, the second opening having a smaller area than the first opening in plan-view; and forming a wiring layer in the first opening and the second opening such that the wiring layer is in contact with the electrode, wherein the second layer includes a portion located on an upper surface of the first layer and a portion located in the first opening, and the portion of the second layer located in the first opening covers an internal side surface of the first layer located around the first opening.

Through the above configuration, the internal side surface of the first layer, which is located around the first opening, is covered by the portion of the second layer located in the first opening. Consequently, the first layer is not directly exposed to a gas or liquid chemical used in a process step after formation of the second layer. Therefore, when openings are formed in the first layer and the second layer in order to form a contact hole, degradation of the first layer can be restricted even if the first layer is made of a material that has a low tolerance against the aforementioned gas or liquid chemical.

Alternatively, the first opening may have a smaller area than the electrode in plan-view, and a lower surface of the portion of the second layer in the first opening may be in contact with an upper surface of the electrode around an entire perimeter of the first opening in plan-view.

Alternatively, the first layer may be a bank layer having a third opening therein at a different position to the first opening, the third opening being for formation of a functional material layer, and the second layer may be an overcoat layer that covers the functional material layer formed in the third opening.

Alternatively, the base substrate may include a gate insulating film on which the electrode is formed, and the functional material layer may be a semiconductor layer formed on the gate insulating film.

Alternatively, the first layer may be a gate insulating film, and the second layer may be a bank layer having a third opening therein at a different position to the second opening, the third opening being for formation of a functional material layer.

A display panel relating to one aspect of the present invention comprises: a base substrate; an electrode located on an upper surface of the base substrate; a first layer located on the base substrate and having a first opening therein at a position overlapping with the electrode in plan-view; a second layer located on the first layer and having a second opening therein at a position overlapping with the first opening in plan-view, the second opening having a smaller area than the first opening in plan-view; and a wiring layer located in the first opening and the second opening, in contact with the electrode, wherein the second layer includes a portion located on an upper surface of the first layer and a portion located in the first opening, and the portion of the second layer located in the first opening covers an internal side surface of the first layer located around the first opening.

Embodiments of the present disclosure are described below in detail with reference to the drawings.

[First Embodiment]

<Overall Configuration>

FIG. 1 is a cross-sectional diagram illustrating structure of a display panel relating to a first embodiment of the present disclosure. Note that structure illustrated in FIG. 1 and explanation thereof is for a single pixel. The display panel includes a substrate 1, gate electrodes 2, a gate insulating film 3, S-D electrodes 4, a bank layer 5, semiconductor layer portions 6, an overcoat layer 7, a planarizing layer 8, a pixel electrode 9, a bank layer 10, an organic EL layer 11, a common electrode 12, and a sealing layer 13. The gate electrodes 2, the gate insulating film 3, the S-D electrodes 4, and the semiconductor layer portions 6 compose transistors which configure a drive circuit. The transistors are organic or inorganic thin film transistors (TFTs). In the present embodiment, each of the pixels includes two transistors. The pixel electrode 9, the organic EL layer 11, and the common electrode 12 compose a light-emitting element. The bank layer 5, the overcoat layer 7 and the planarizing layer 8 compose an insulating layer located between the drive circuit and the light-emitting element. In region A indicated in FIG. 1, the bank layer 5, the overcoat layer 7 and the planarizing layer 8 each have an opening therein at a position overlapping with one of the S-D electrodes 4 in plan-view. The openings described above compose a contact hole. A portion of the pixel electrode 9 extends into the contact hole along an internal side surface of the planarizing layer 8 located around the contact hole. The pixel electrode 9 is in contact with the S-D electrode 4, which is exposed at a bottom part of the contact hole. The portion of the pixel electrode 9 which is located in the contact hole functions as a wiring layer that is in contact with the S-D electrode 4.

Also, in region A indicated in FIG. 1, the overcoat layer 7 includes an overcoat layer portion 71 which is located on an upper surface of the bank layer 5, and an overcoat layer portion 72 which is located in the opening in the bank layer 5. The overcoat layer portion 72, located in the opening in the bank layer 5, covers an internal side surface 51 of the bank layer 5 located around the opening in the bank layer 5. As a result of the above, the opening in the overcoat layer 7 has a smaller area than the opening in the bank layer 5 in plan-view. Through the structure described above, the bank layer 5 is not directly exposed to a gas or liquid chemical which is used in a process step after formation of the overcoat layer 7. Consequently, degradation of the bank layer 5 can be restricted, even when the bank layer 5 is made of a material that has a low tolerance against the aforementioned gas or liquid chemical.

<Configuration of Layers>

The substrate 1 can be formed from a commonly known insulating material such as a resin or glass.

The gate electrodes 2, the gate insulating film 3, the S-D electrodes 4, and the semiconductor layer portions 6 can be formed from commonly known materials used in an organic or inorganic TFT. In the present embodiment the semiconductor layer portions 6 are made of a material that can be formed using an application method such as an inkjet method.

The bank layer 5 is made of a photosensitive insulating material. A primary function of the bank layer 5 is to prevent ink including a material for the semiconductor layer portions 6 from flowing away from target positions when forming the semiconductor layer portions 6 by the application method. The bank layer 5 has openings for forming the semiconductor layer portions 6 by the application method, and an opening for forming a contact hole.

The overcoat layer 7 is made of a photosensitive insulating material. A primary function of the overcoat layer 7 is to cover the semiconductor layer portions 6. The overcoat layer 7 has an opening for forming the contact hole.

The planarizing layer 8 is made of a photosensitive insulating material. A primary function of the planarizing layer 8 is to provide a planarized upper surface. The planarizing layer 8 has an opening for forming the contact hole.

The pixel electrode 9, the organic EL layer 11 and the common electrode 12 can be formed from commonly known materials used in an organic EL element. The organic EL layer 11 includes a light-emitting layer, and may also include a hole injection layer, a hole transport layer, an electron injection layer, and an electron transport layer in accordance with respective necessity thereof.

The bank layer 10 is made of a photosensitive insulating material. A primary function of the bank layer 10 is to prevent ink including a material for the organic EL layer 11 from flowing away from a target position when forming the organic EL layer 11 by an application method.

The sealing layer 13 is made of a light-transmitting insulating material. A primary function of the sealing layer 13 is to prevent penetration of moisture and gas to the light-emitting element and the drive circuit.

<Method of Production>

FIGS. 2A-2E, 3A-3C, 4A, 4B, 5A, 5B, 6A-6C, and 7 are cross-sectional diagrams for explaining a production process of the display panel illustrated in FIG. 1.

First the substrate 1 is prepared, and subsequently the gate electrodes 2 and the gate insulating film 3 are formed on the substrate 1 (FIG. 2A). The gate electrodes 2 can for example be formed by a process in which a conductive material, from which the gate electrodes 2 are to be formed, is first layered on the substrate 1, and next a resist pattern is funned on the conductive material. The conductive material is subsequently etched through the resist pattern, and finally the resist pattern is removed. The gate insulating film 3 has a contact hole for allowing contact between the gate electrodes 2 and the S-D electrodes 4. The gate insulating film 3 can for example be formed by a process in which a gate insulating material layer, from which the gate insulating film 3 is to be formed, is first layered on the substrate 1 on which the gate electrodes 2 have been formed, and next a photomask is arranged over the gate insulating material layer. The gate insulating material layer is subsequently exposed to light through the photomask, and finally the gate insulating material layer is developed.

Next, an S-D material layer 4a, from which the S-D electrodes 4 are to be formed, is layered on the gate insulating film 3 (FIG. 2B). A resist pattern 4b having openings 4c is formed on the S-D material layer 4a (FIG. 2C). After etching of the S-D material layer 4a through the resist pattern 4b (FIG. 2D), the resist pattern 4b is removed (FIG. 2E). Through the above, a base substrate can be prepared having an upper surface on which the S-D electrodes 4 have been formed. The S-D electrodes 4 may have a single layer structure, or may alternatively have a multi-layer structure. If the S-D electrodes 4 have a single layer structure, the S-D electrodes 4 can be formed in a single process step, simplifying production. If the S-D electrodes 4 have a multi-layer structure, appropriate materials for the layers can be selected in accordance with respective functions thereof. For example, a lower layer may be made of a material having a strong adhesion to the base substrate and an upper layer may be made of a material having high electrical conductivity. In the example of structure described above, the lower layer may for example be made of titanium (Ti) and have a film thickness of an order of several nanometers, and the upper layer may be made of gold (Au) and have a film thickness in a range of 50 nm to 100 nm.

Figure 3A:
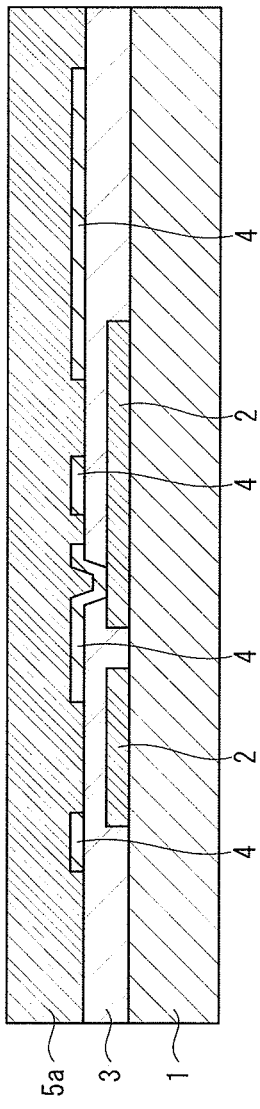
FIGS. 3A-3C are cross-sectional diagrams for explaining the production process of the display panel illustrated in FIG. 1.
Figure 3B:
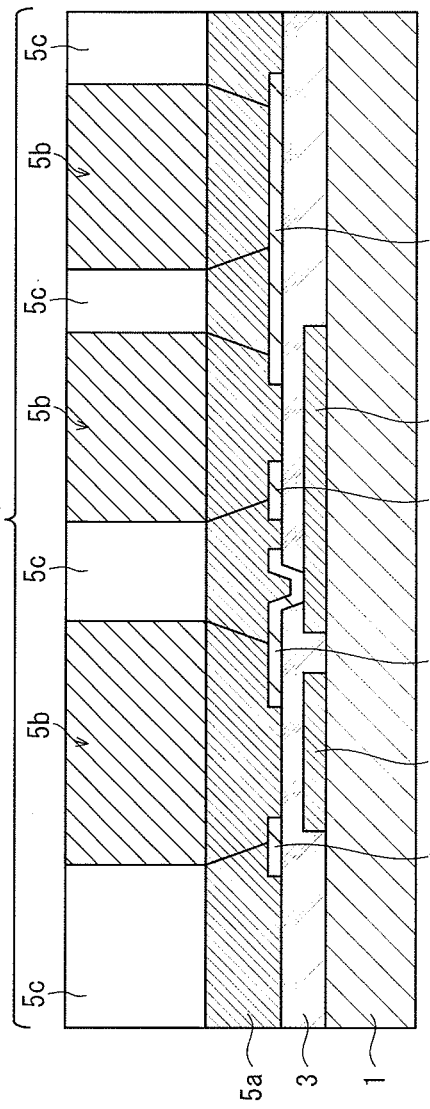
Figure 3C:
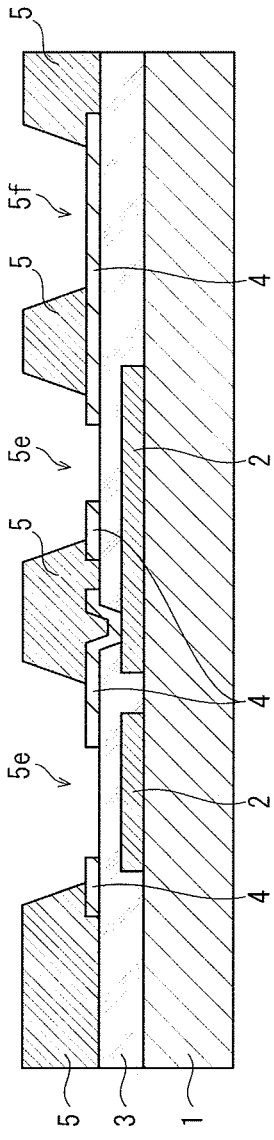

Next, a bank material layer 5a, from which the bank layer 5 is to be formed, is layered on the base substrate on which the S-D electrodes 4 have been formed (FIG. 3A). A photomask 5d is arranged over the bank material layer 5a, the bank material layer 5a is exposed to light through the photomask 5d (FIG. 3B), and subsequently the bank material layer 5a is developed. As a result of the above process, the bank layer 5 can be formed such that the bank layer 5 has openings 5e for forming the semiconductor layer portions 6, and an opening 5f for forming the contact hole (FIG. 3C). The photomask 5d has light-blocking regions 5b in which light-transmittance is low and aperture regions 5c in which light-transmittance is high. In the present embodiment the bank layer 5 is made from a photosensitive material of a type such that a region that is unexposed to light is removed during developing, and a region that is exposed to light remains during developing. Therefore, the photomask 5*d* is arranged such that in plan-view the light-blocking regions 5*b* overlap with regions of the bank material layer 5*a* in which the openings are to be formed, and the aperture regions 5*c* overlap with all other regions of the bank material layer 5*a*.

Figure 4A:
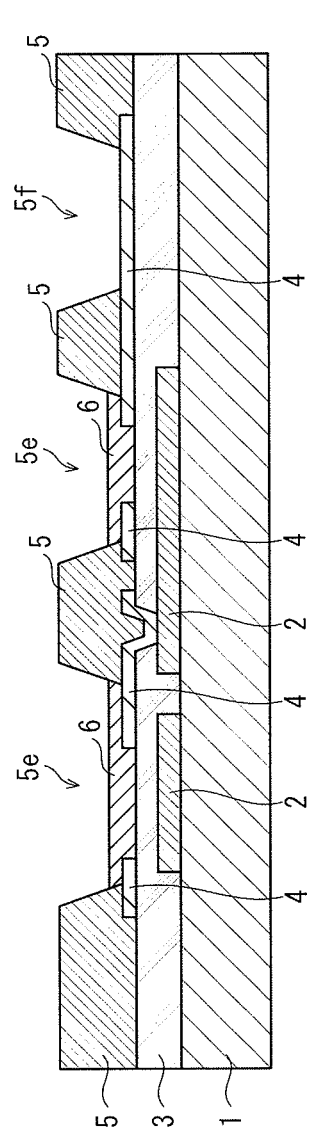
FIGS. 4A and 4B are cross-sectional diagrams for explaining the production process of the display panel illustrated in FIG. 1.

Next, the semiconductor layer portions 6 are formed in the openings 5*e* in the bank layer 5 (FIG. 4A). The semiconductor layer portions 6 can for example be formed by a process in which ink including a solvent and a semiconductor material for forming the semiconductor layer portions 6, is applied into the openings 5*e*, and subsequently the solvent is evaporated leaving the semiconductor material as a residue.

Figure 4B:
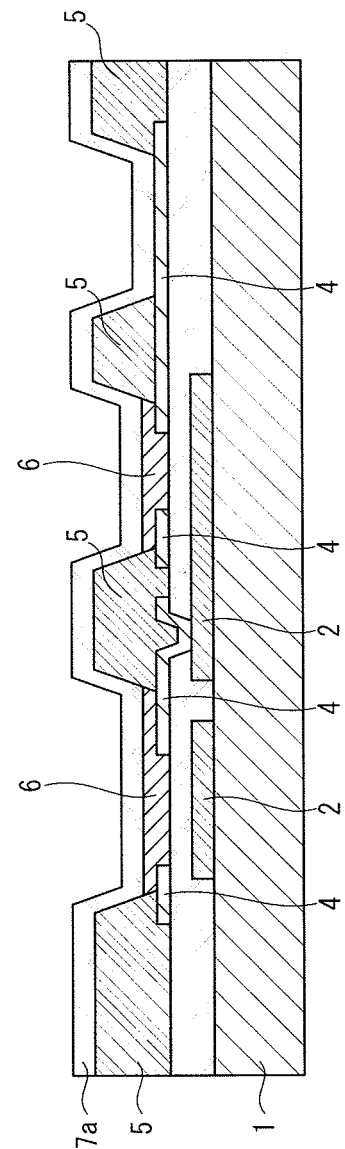
Figures 5A, 5B:
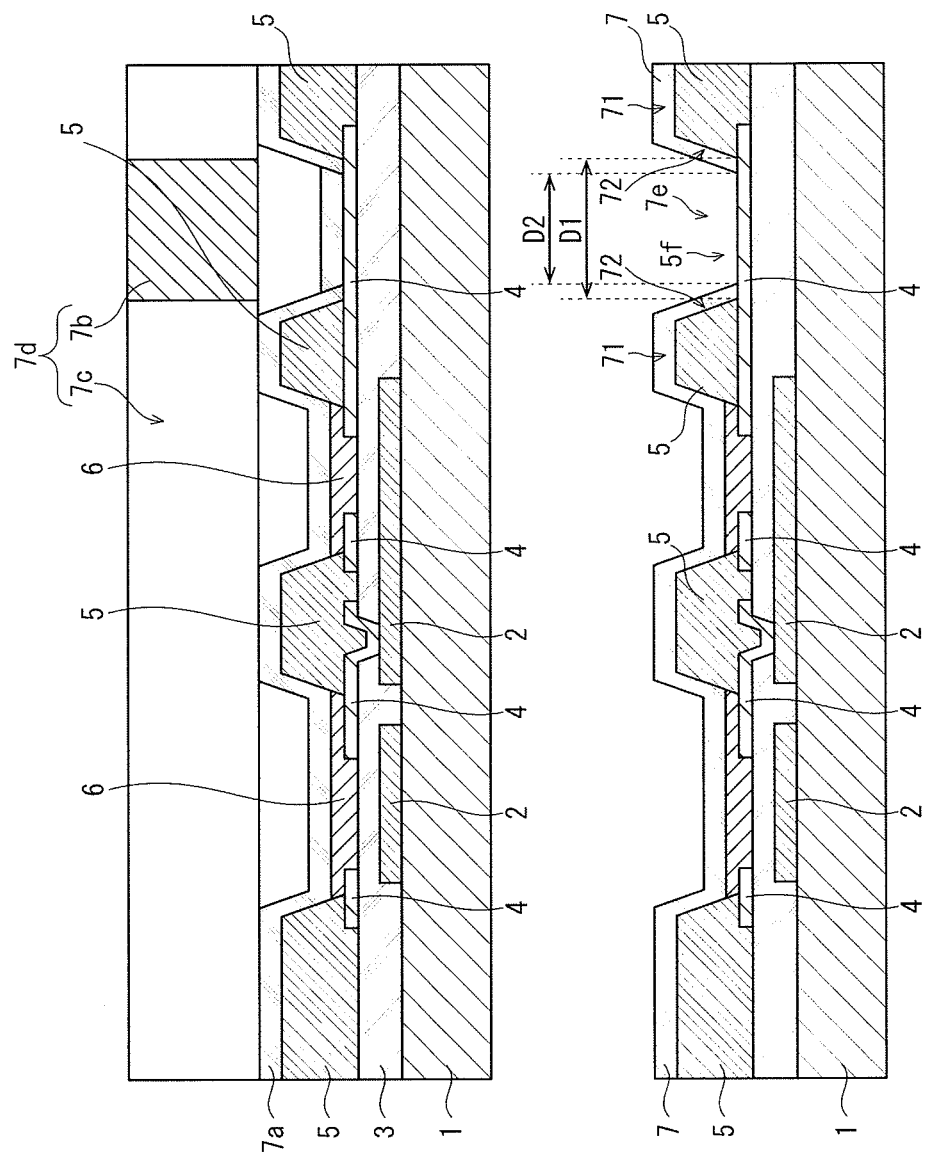
FIGS. 5A and 5B are cross-sectional diagrams for explaining the production process of the display panel illustrated in FIG. 1.

Next, an overcoat material layer 7*a*, from which the overcoat layer 7 is to be formed, is layered on the bank layer 5 and the semiconductor layer portions 6 (FIG. 4B). A photomask is arranged over the overcoat material layer 7*a*, the overcoat material layer 7*a* is exposed to light through the photomask (FIG. 5A), and subsequently the overcoat material layer 7*a* is developed. As a result of the above process, the overcoat layer 7 can be formed such that the overcoat layer 7 has an opening 7*e* for forming the contact hole (FIG. 5B). The photomask 7*d* has a light-blocking region 7*b* in which light-transmittance is low and an aperture region 7*c* in which light-transmittance is high. In the present embodiment, in the same way as the bank layer 5, the overcoat layer 7 is made from a photosensitive material of a type such that a region that is unexposed to light is removed during developing, and a region that is exposed to light remains during developing. Therefore, the photomask 7*d* is arranged such that in plan-view the light-blocking region 7*b* overlaps with a region of the overcoat material layer 7*a* in which the opening is to be formed, and the aperture region 7*c* overlaps with all other regions of the overcoat material layer 7*a*. Note that the opening 7*e* in the overcoat layer 7 has a smaller area than the opening 5*f* in the bank layer 5 in plan-view. In other words, as illustrated in FIG. 5B, the opening 7*e* in the overcoat layer 7 has a diameter D2 which is smaller than a diameter D1 of the opening 5*f* in the bank layer 5. Through the above, the overcoat layer 7 can be formed such as to include the overcoat layer portion 71 located on the upper surface of the bank layer 5, and the overcoat layer portion 72 located in the opening 5*f* in the bank layer 5. The overcoat layer portion 72, located in the opening 5*f* in the bank layer 5, covers an internal side surface of the bank layer 5 located around the opening 5*f* in the bank layer 5. Through the structure described above, the bank layer 5 is not directly exposed to a gas or liquid chemical that is used in a process step after formation of the overcoat layer 7. Consequently, degradation of the bank layer 5 can be restricted, even when the bank layer 5 is made of a material that has a low tolerance against the aforementioned gas or liquid chemical.

Next, a planarizing material layer 8*a*, from which the planarizing layer 8 is to be formed, is layered on the overcoat layer 7 in which the opening has been formed (FIG. 6A). A photomask 8*d* is arranged over the planarizing material layer 8*a*, the planarizing material layer 8*a* is exposed to light through the photomask 8*d* (FIG. 6B), and subsequently the planarizing material layer 8*a* is developed. As a result of the above process, the planarizing layer 8 can be formed such that the planarizing layer 8 has a contact hole 8*e* therein (FIG. 6C). The photomask 8*d* has a light-blocking region 8*b* in which light-transmittance is low and an aperture region 8*c* in which light-transmittance is high. In the present embodiment, in contrast to the bank layer 5, the planarizing layer 8 is made from a photosensitive material of a type such that a region that is exposed to light is removed during developing, and a region that is unexposed to light remains during developing. Therefore, the photomask 8*d* is arranged such that in plan-view the aperture region 8*c* overlaps with a region of the planarizing material layer 8*a* in which the opening is to be formed, and the light-blocking region 8*b* overlaps with all other regions of the planarizing material layer 8*a*.

Figure 7:
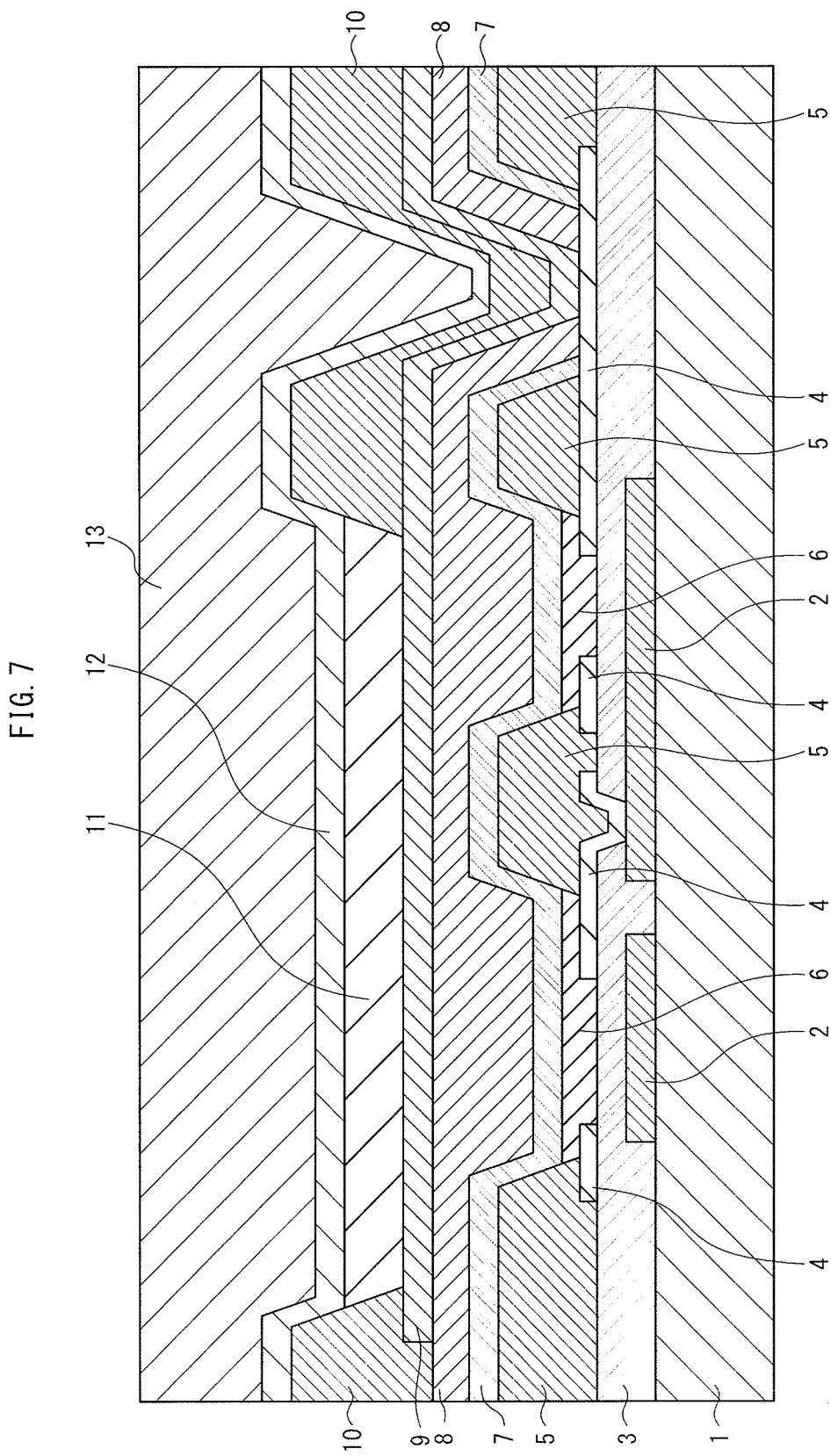
FIG. 7 is a cross-sectional diagram for explaining the production process of the display panel illustrated in FIG. 1.

Production of the display panel can be completed by subsequently forming the pixel electrode 9, the bank layer 10, the organic EL layer 11, the common electrode 12, and the sealing layer 13 in respective order (FIG. 7).

[Second Embodiment]

In the first embodiment explanation was given for an example wherein, in terms of layers in which openings are provided for forming a contact hole, the bank layer 5 corresponds to the first layer and the overcoat layer 7 corresponds to the second layer located on the first layer. However, the above is not a limitation on the present disclosure, and so long as an opening in the first layer and an opening in the second layer are formed by separate processes, the present disclosure may be adopted for any other combination of layers.

In a second embodiment explanation is given of an example wherein, in terms of layers in which openings are provided for forming a contact hole, a gate insulating film 3 corresponds to the first layer and a bank layer 5 corresponds to the second layer. Note that explanation is omitted for parts of configuration which are the same as in the first embodiment.

<Overall Configuration>

Figure 8:
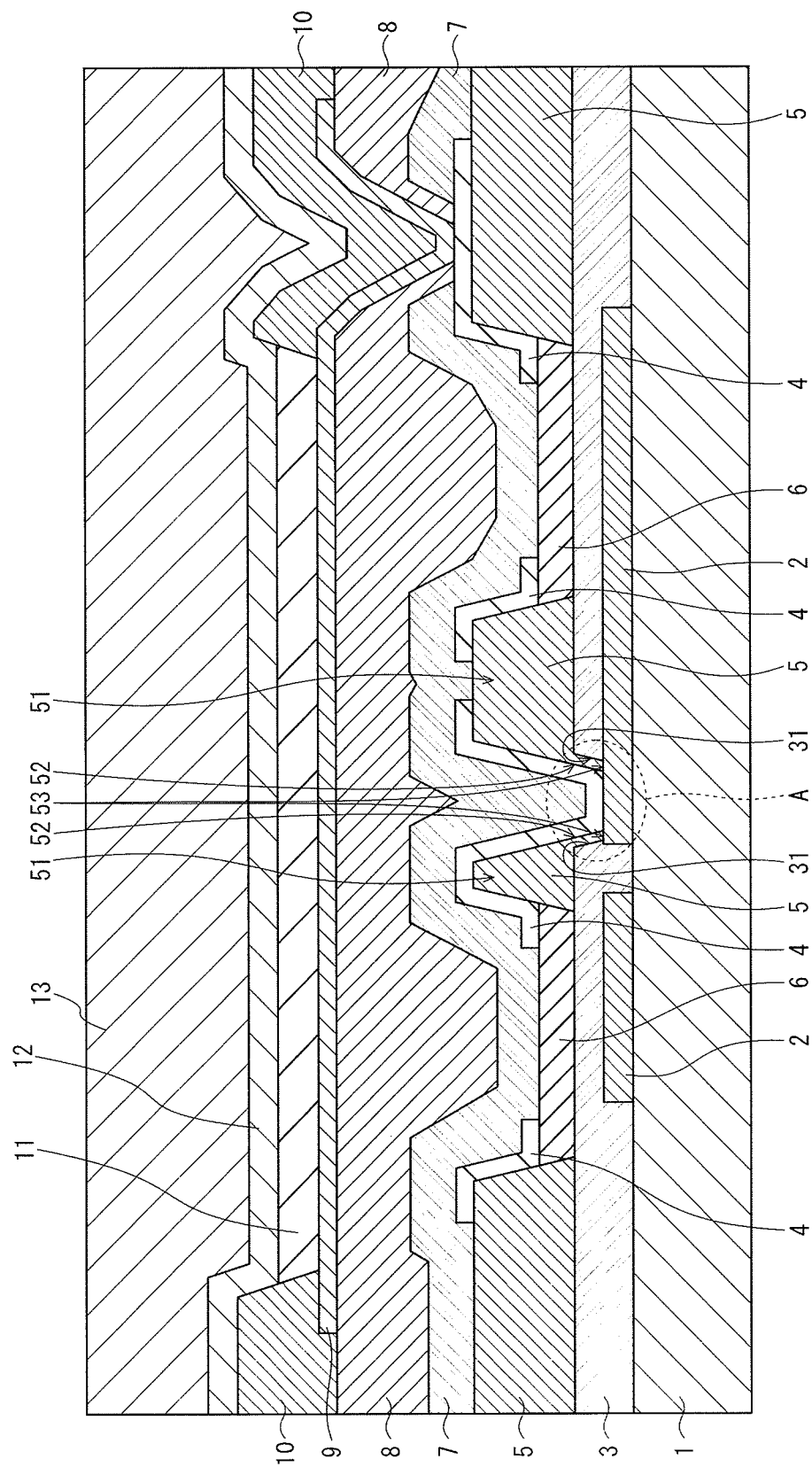
FIG. 8 is a cross-sectional diagram illustrating structure of a display panel relating to a second embodiment of the present disclosure.

FIG. 8 is a cross-sectional diagram illustrating structure of a display panel relating to the second embodiment of the present disclosure. The display panel includes a substrate 1, gate electrodes 2, the gate insulating film 3, S-D electrodes 4, the bank layer 5, semiconductor layer portions 6, an overcoat layer 7, a planarizing layer 8, a pixel electrode 9, a bank layer 10, an organic EL layer 11, a common electrode 12, and a sealing layer 13.

The first embodiment has a bottom-gate, bottom-contact transistor structure, and consequently the S-D electrodes 4 are located in contact with lower sections of the semiconductor layer portions 6. In contrast to the first embodiment, the second embodiment has a bottom-gate, top-contact transistor structure, and consequently the S-D electrodes 4 are located in contact with upper sections of the semiconductor layer portions 6.

In region A indicated in FIG. 8, the gate insulating film 3 and the bank layer 5 each have an opening at a position that overlaps with one of the gate electrodes 2 in plan-view. The respective openings in the gate insulating film 3 and the bank layer 5 form a contact hole. A portion of one of the S-D electrodes 4 extends into the contact hole along an internal side surface of the bank layer 5 located around the contact hole. The S-D electrode 4 is in contact with the gate electrode 2, which is exposed at a bottom part of the contact hole. The portion of the S-D electrode 4 which is located in the contact hole functions as a wiring layer that is in contact with the gate electrode 2.

In region A indicated in FIG. 8, the bank layer 5 includes a bank layer portion 51 located on an upper surface of the gate insulating film 3 and a bank layer portion 52 located in the opening in the gate insulating film 3. The bank layer portion 52, located in the opening in the gate insulating film 3, covers an internal side surface 31 of the gate insulating film 3 located around the opening in the gate insulating film 3. As a result of the above, the opening in the bank layer 5 has a smaller area than the opening in the gate insulating film 3. Through the structure described above, the gate insulating film 3 is not directly exposed to a gas or liquid chemical that is used in a process step after formation of the bank layer 5. Consequently, degradation of the gate insulating film 3 can be restricted, even when the gate insulating film 3 is made of a material that has a low tolerance against the aforementioned gas or liquid chemical.

<Method of Production>

FIGS. 9A-9C, 10A-10C, 11A-11C, 12A, 12B, 13A, 13B and 14 are cross-sectional diagrams for explaining a production process of the display panel illustrated in FIG. 8.

First the substrate 1 is prepared, and subsequently the gate electrodes 2 are formed on the substrate 1. Through the above, a base substrate can be prepared having an upper surface on which the gate electrodes 2 have been formed.

Figure 9A:
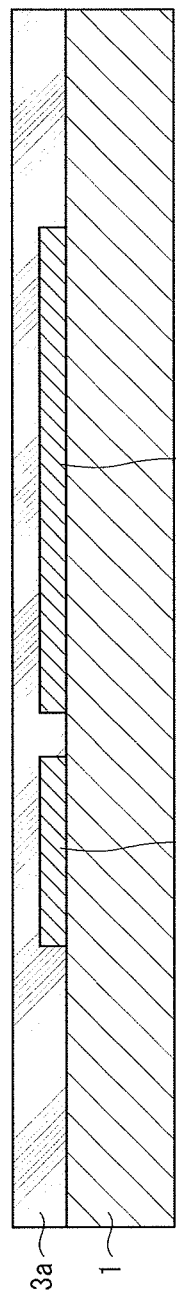
FIGS. 9A-9C are cross-sectional diagrams for explaining a production process of the display panel illustrated in FIG. 8.
Figure 9B:
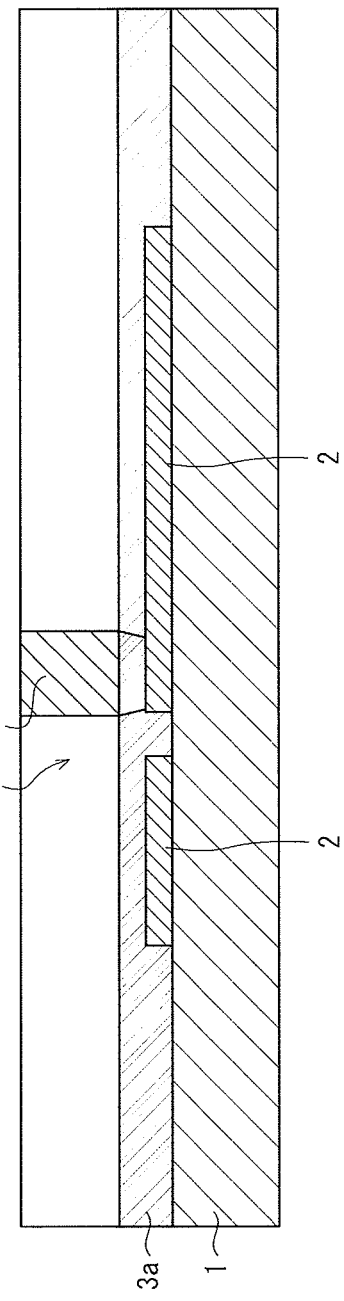
Figure 9C:
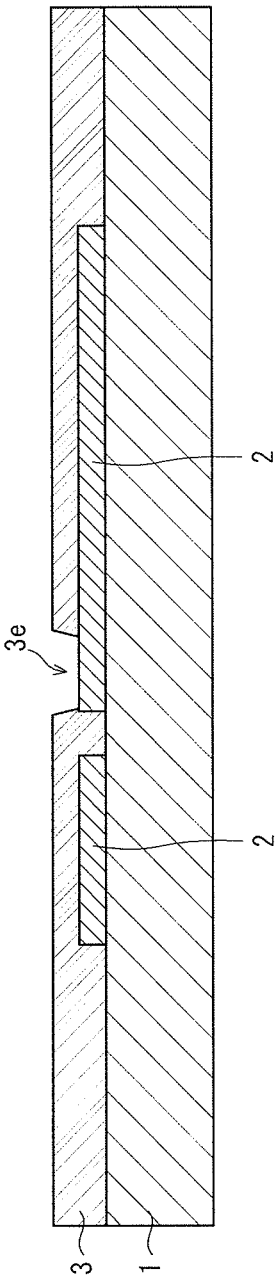

Next, a gate insulating material layer 3a, from which the gate insulating film 3 is to be formed, is layered on the base substrate on which the gate electrodes 2 have been formed (FIG. 9A). A photomask 3d is arranged over the gate insulating material layer 3a, the gate insulating material layer 3a is exposed to light through the photomask 3d (FIG. 9B), and subsequently the gate insulating material layer 3a is developed. As a result of the above process, the gate insulating film 3 can be formed such that the gate insulating film 3 has an opening 3e therein for forming the contact hole (FIG. 9C). The photomask 3d has a light-blocking region 3b in which light-transmittance is low and an aperture region 3c in which light-transmittance is high. In the present embodiment the gate insulating film 3 is made from a photosensitive material of a type such that a region that is unexposed to light is removed during developing, and a region that is exposed to light remains during developing. Therefore, the photomask 3d is arranged such that in plan-view the light-blocking region 3b overlaps with a region of the gate insulating material layer 3a in which the opening is to be formed, and the aperture region 3c overlaps with all other regions of the gate insulating material layer 3a.

Figure 10A:
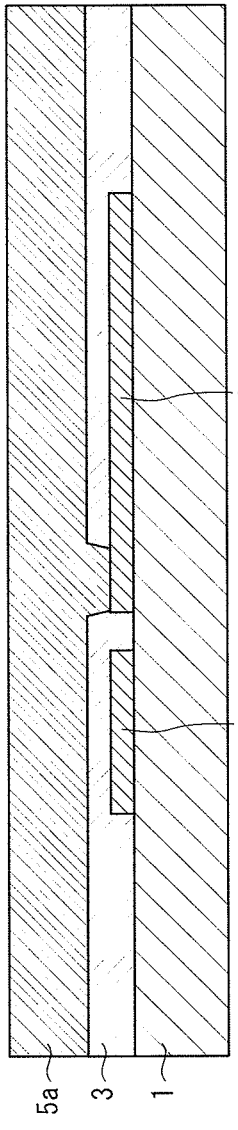
FIGS. 10A-10C are cross-sectional diagrams for explaining the production process of the display panel illustrated in FIG. 8.
Figure 10B:
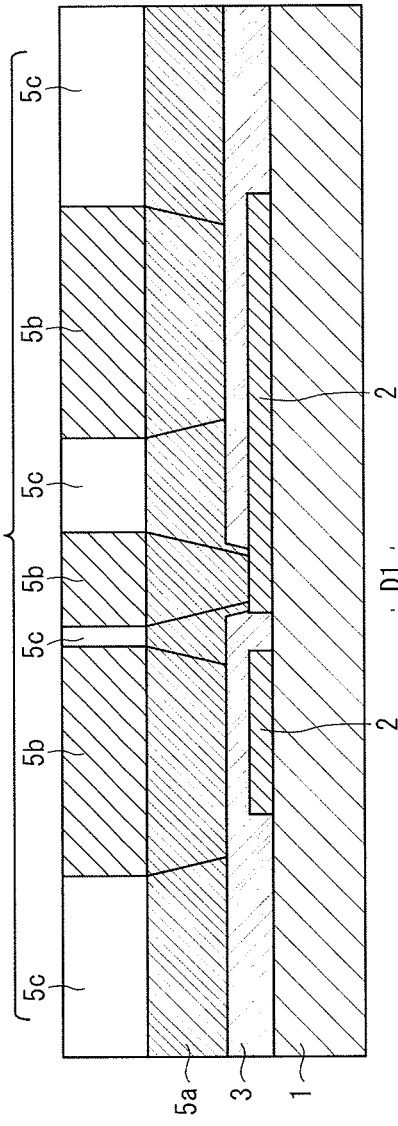
Figure 10C:
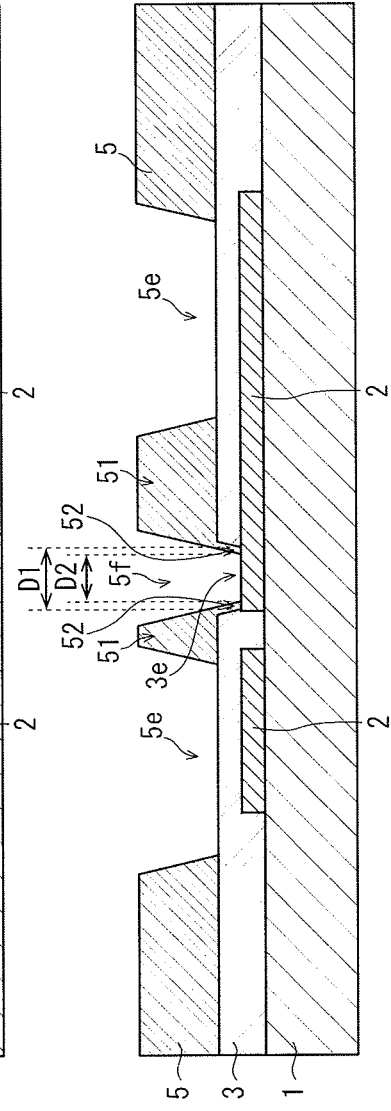

Next, a bank material layer 5a, from which the bank layer 5 is to be formed, is layered on the gate insulating film 3 (FIG. 10A). A photomask 5d is arranged over the bank material layer 5a, the bank material layer 5a is exposed to light through the photomask 5d (FIG. 10B), and subsequently the bank material layer 5a is developed. As a result of the above process, the bank layer 5 can be formed such that the bank layer 5 has openings 5e for forming the semiconductor layer portions 6 and an opening 5f for forming the contact hole (FIG. 10C). The photomask 5d has light-blocking regions 5b in which light-transmittance is low and aperture regions 5c in which light-transmittance is high. In the present embodiment the bank layer 5 is made from a photosensitive material of a type such that a region that is unexposed to light is removed during developing, and a region that is exposed to light remains during developing. Therefore, the photomask 5d is arranged such that in plan-view the light-blocking regions 5b overlap with regions of the bank material layer 5a in which the openings are to be formed, and the aperture regions 5c overlap with all other regions of the bank material layer 5a. Note that the opening 5f in the bank layer 5 has a smaller area than the opening 3e in the gate insulating film 3 in plan-view. In other words, as illustrated in FIG. 10C, the opening 5f in the bank layer 5 has a diameter D2 which is smaller than a diameter D1 of the opening 3e in the gate insulating film 3. Through the above process, the bank layer 5 can be formed such that the gate layer portion 51 is located on an upper surface of the gate insulating film 3, and the gate layer portion 52 is located in the opening 3e in the gate insulating film 3. The bank layer portion 52, located in the opening 3e in the gate insulating film 3, covers an internal side surface of the gate insulating film 3 located around the opening 3e in the gate insulating film 3. Through the structure described above, the gate insulating film 3 is not directly exposed to a gas or liquid chemical which is used in a process step after formation of the bank layer 5. Consequently, degradation of the gate insulating film 3 can be restricted, even when the gate insulating film 3 is made of a material that has a low tolerance against the aforementioned gas or liquid chemical.

Figure 11A:
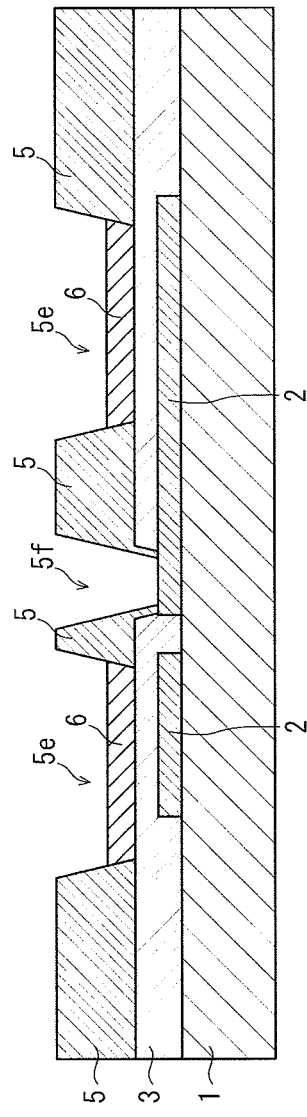
FIGS. 11A-11C are cross-sectional diagrams for explaining the production process of the display panel illustrated in FIG. 8.

Next, the semiconductor layer portions 6 are formed in the openings 5e in the bank layer 5 (FIG. 11A).

Figure 11B:
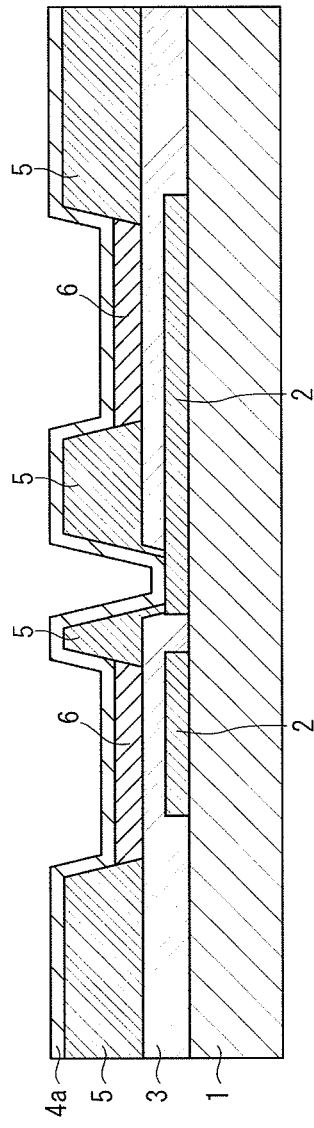
Figure 11C:
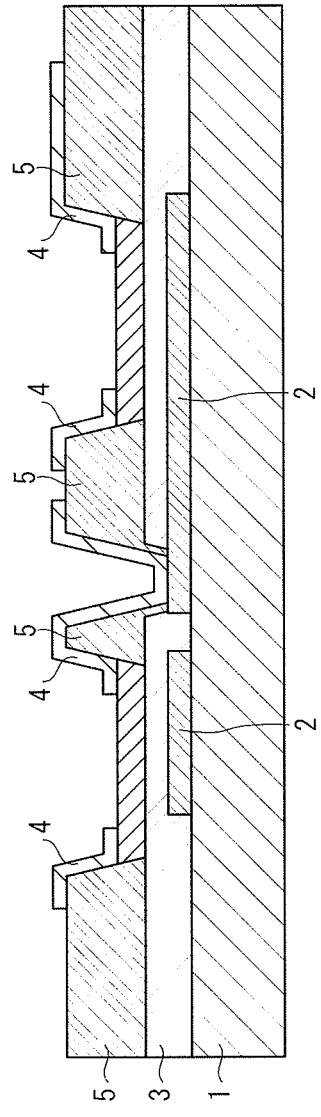

Next, an S-D material layer 4a, from which the S-D electrodes 4 are to be formed, is layered on the bank layer 5 and the semiconductor layer portions 6 (FIG. 11B). The S-D electrodes 4 are formed from the S-D material layer 4a through a process of etching (FIG. 11C). The S-D electrodes 4 may have a single layer structure, or may alternatively have a multi-layer structure. If the S-D electrodes 4 have a single layer structure, the S-D electrodes 4 can be formed in a single process step, simplifying production. On the other hand, if the S-D electrodes 4 have a multi-layer structure, appropriate materials for forming the layers can be selected in accordance with respective functions of the layers. For example, a lower layer may be formed from a material with a high charge injection property in consideration of interlayer resistance with the semiconductor, and an upper layer may be formed from a material having a low tendency to disconnect in consideration of a thermal expansion coefficient of the substrate. In the example of structure described above, the lower layer may for example be made of copper (Cu) and have a film thickness of an order of several nanometers, and the upper layer may be made of molybdenum (Mo) and have a film thickness in a range of 50 nm to 100 nm.

Figure 12A:
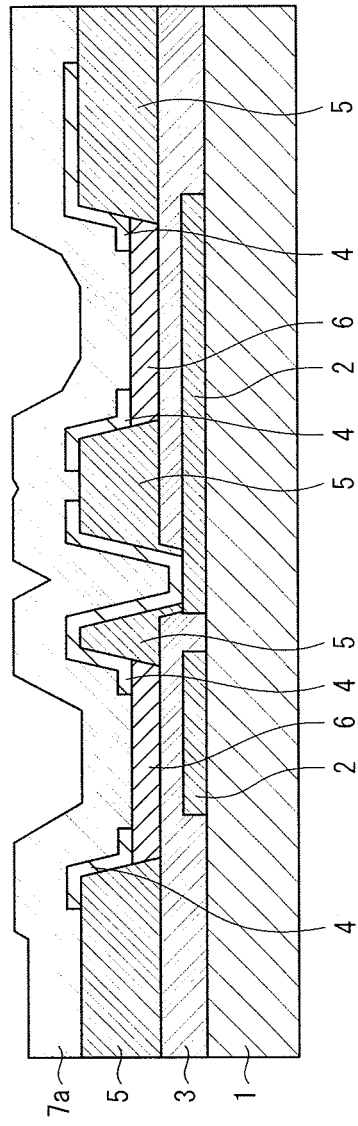
FIGS. 12A and 12B are cross-sectional diagrams for explaining the production process of the display panel illustrated in FIG. 8.
Figure 12B:
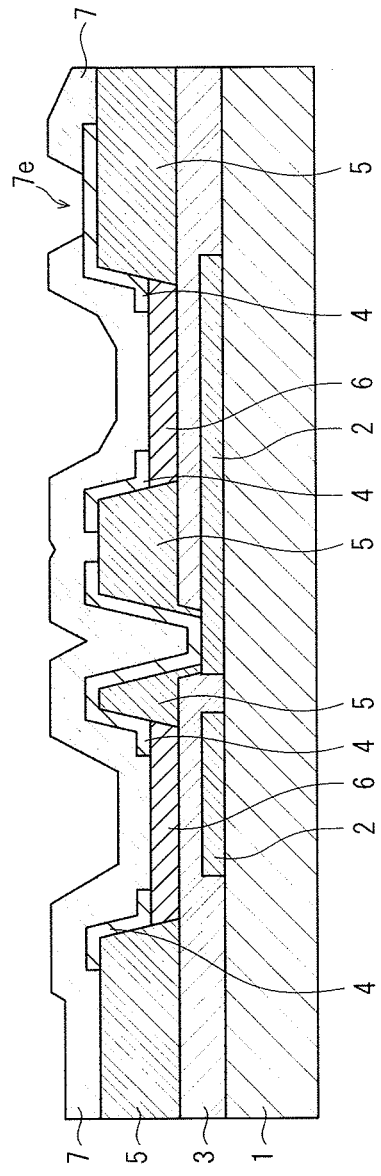

Next, an overcoat material layer 7a, from which the overcoat layer 7 is to be formed, is layered on the bank layer 5 on which the S-D electrodes 4 have been formed (FIG. 12A). The overcoat material layer 7a is exposed to light through a photomask and is developed to form the overcoat layer 7 such that the overcoat layer 7 has an opening 7e for forming a contact hole (FIG. 12B).

Figure 13A:
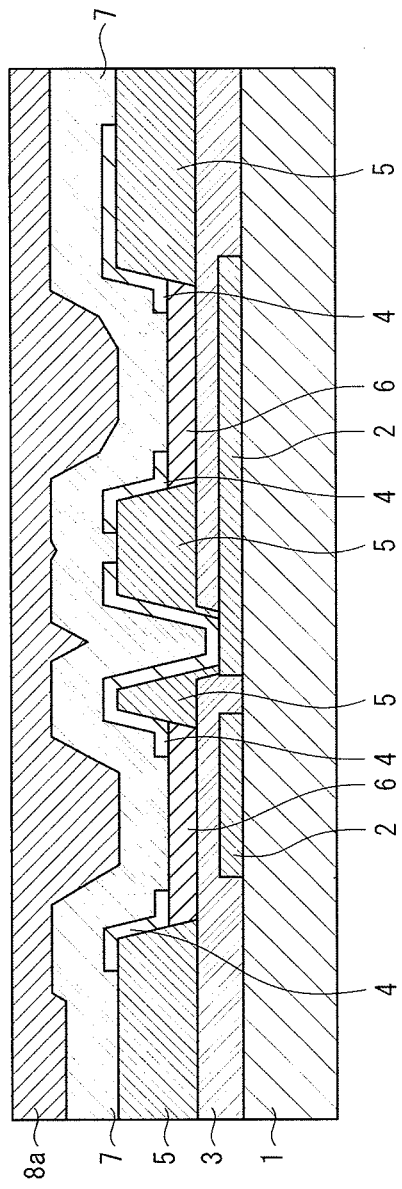
FIGS. 13A and 13B are cross-sectional diagrams for explaining the production process of the display panel illustrated in FIG. 8.
Figure 13B:
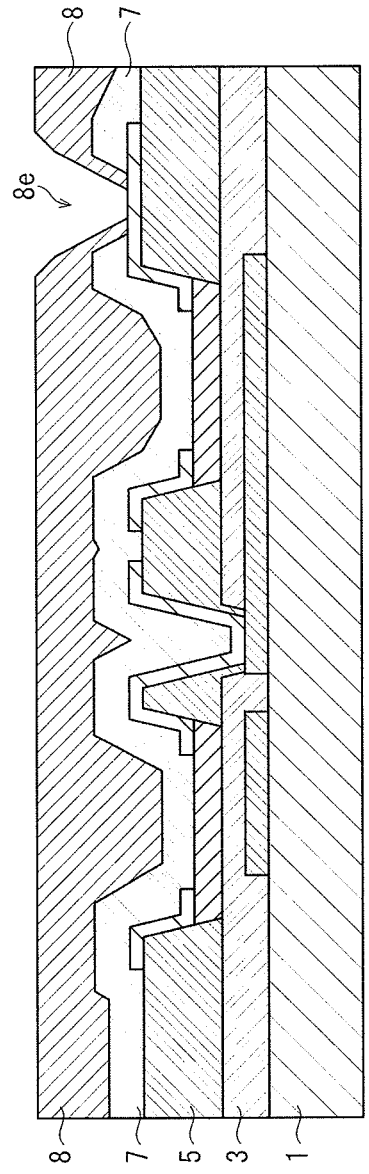

Next, a planarizing material layer 8a, from which the planarizing layer 8 is to be formed, is layered on the overcoat layer 7 in which the opening has been formed (FIG. 13A). The planarizing material layer 8a is exposed to light through a photomask and is developed to form the planarizing layer 8 such that the planarizing layer 8 has a contact hole 8e (FIG. 13B).

Figure 14:
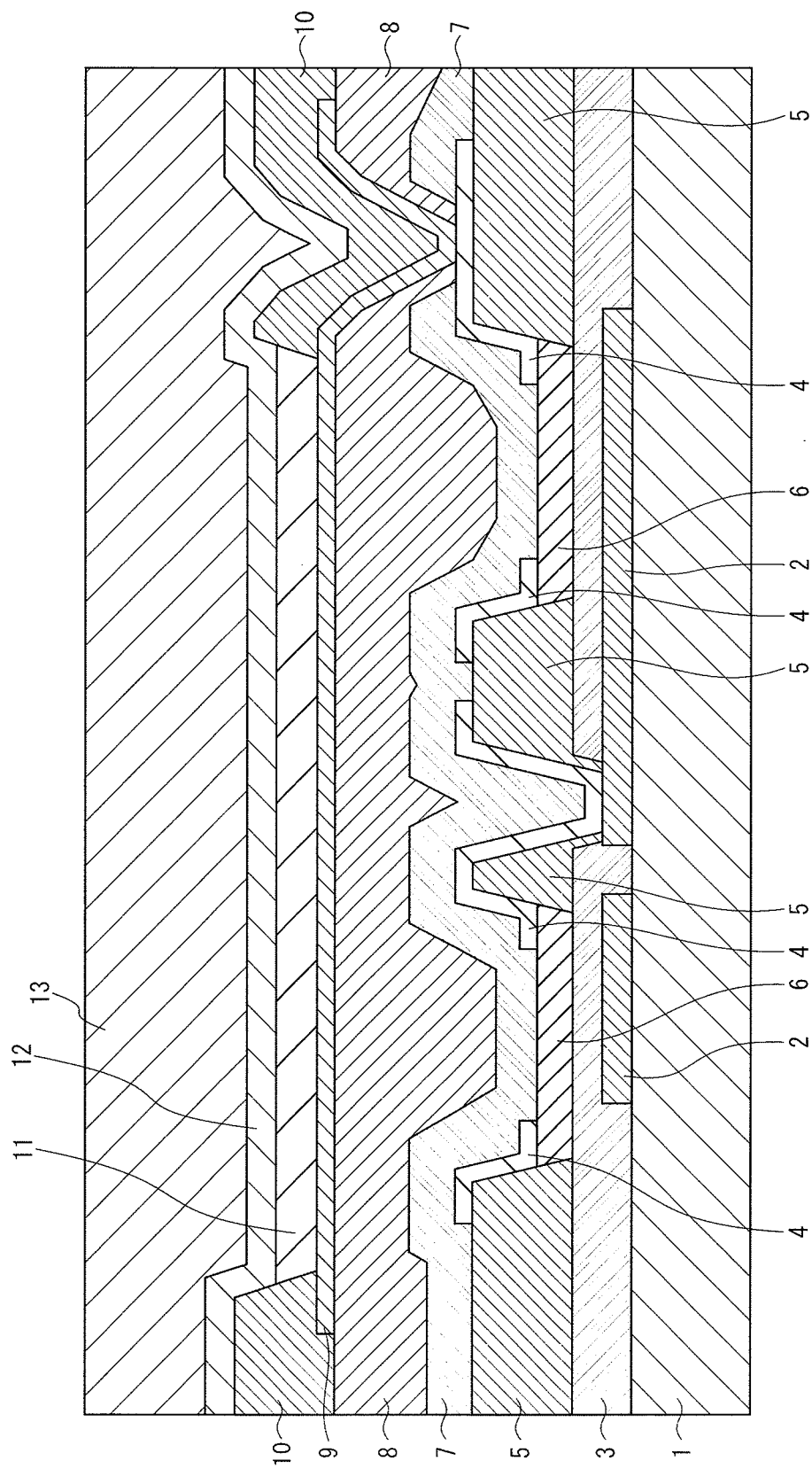
FIG. 14 is a cross-sectional diagram for explaining the production process of the display panel illustrated in FIG. 8.

Production of the display panel can be completed by subsequently forming the pixel electrode 9, the bank layer 10, the organic EL layer 11, the common electrode 12, and the sealing layer 13 in respective order (FIG. 14).

[Modified Examples]

The above describes embodiments of the present disclosure, but the present disclosure is of course not limited to the above embodiments. For example, modified examples such as described below may also be considered.

(1) Number of Layers

In the embodiments, an opening is formed in each layer of a two layer structure, but the present disclosure is not limited to a two layer structure, and may alternatively be applied to a layered structure of three or more layers. When the layered structure has three or more layers, an opening in an $N^{th}$ layer should have a smaller area than an opening in an $(N-1)^{th}$ layer (N is an integer greater than 1).

Figure 15:
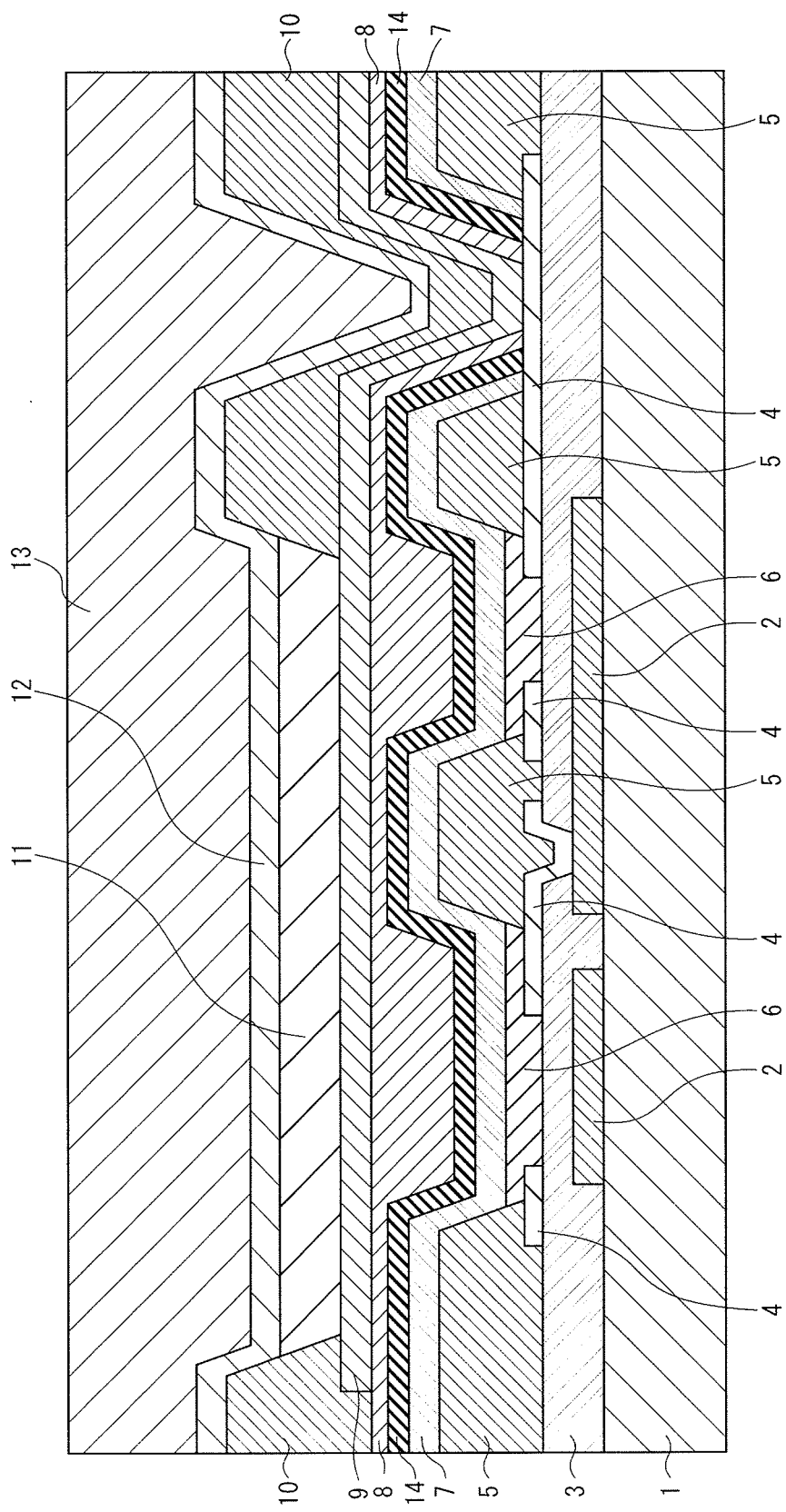
FIG. 15 is a cross-sectional diagram illustrating structure of a display panel relating to a modified example of the first embodiment of the present disclosure.

FIG. 15 is a cross-sectional diagram illustrating structure of a display panel relating to a modified example of the first embodiment of the present disclosure. In the example illustrated in FIG. 15, an additional overcoat layer 14 is formed on the overcoat layer 7. In all other respects configuration is the same as in the first embodiment. The overcoat layer 14 is made of a photosensitive insulating material. A primary function of the overcoat layer 14 is to cover the overcoat layer 7. An opening is formed in the overcoat layer 14 in order to form a contact hole.

FIGS. 16A, 16B, 17A, and 17B are cross-sectional diagrams for explaining a production process of the display panel illustrated in FIG. 15.

Figure 16A:
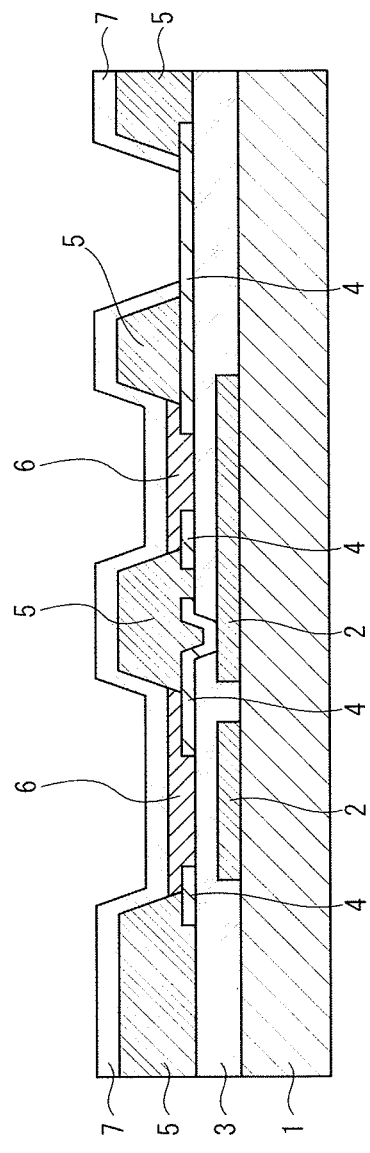
FIGS. 16A and 16B are cross-sectional diagrams for explaining a production process of the display panel illustrated in FIG. 15.
Figure 16B:
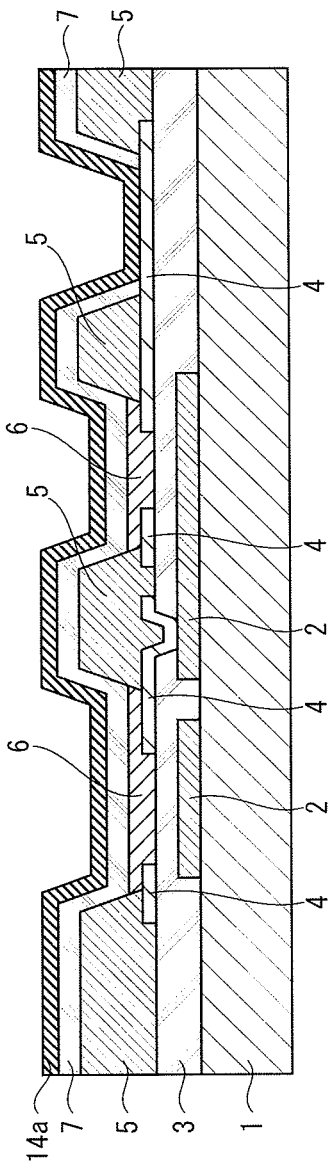
Figures 17A, 17B:
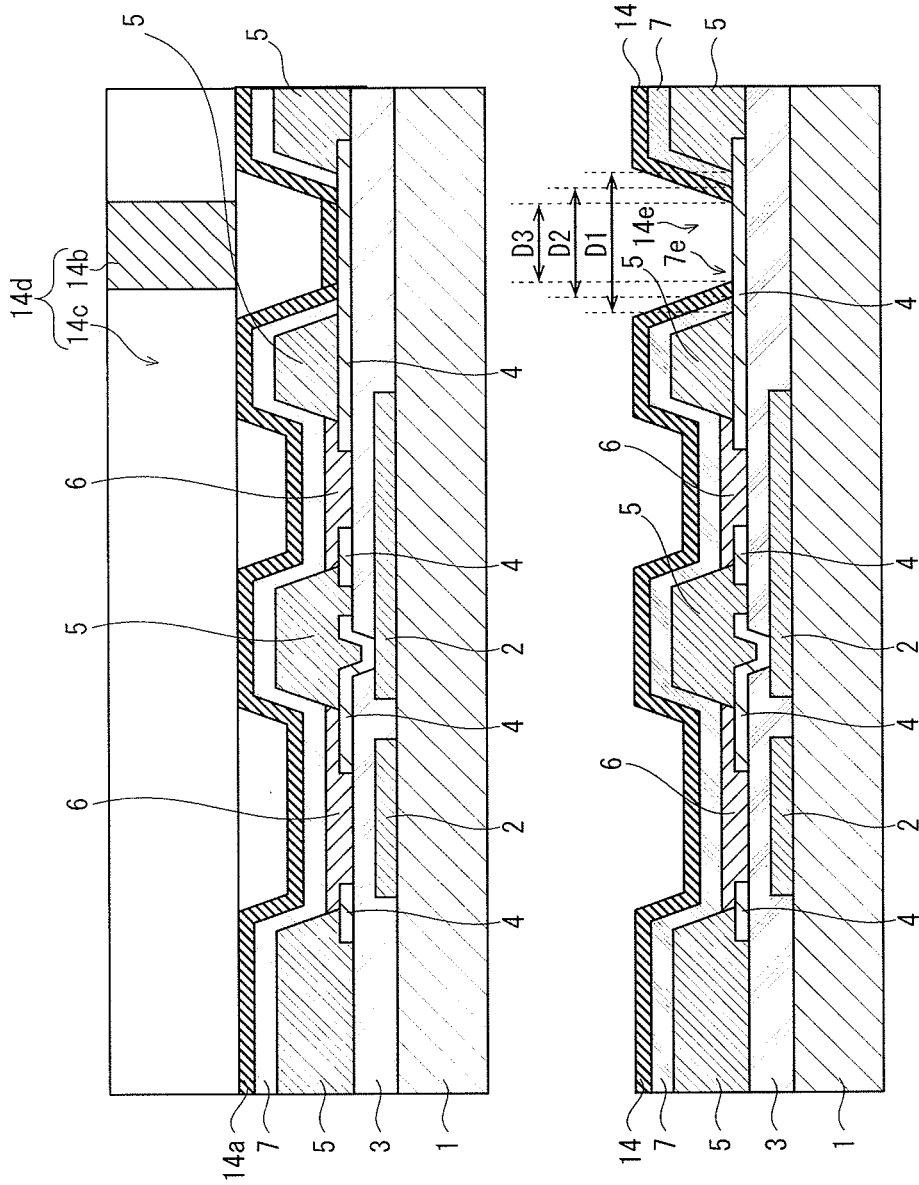
FIGS. 17A and 17B are cross-sectional diagrams for explaining the production process of the display panel illustrated in FIG. 15.

An opening is formed in the overcoat layer 7 (FIG. 16A), and subsequently an overcoat material layer 14a, from which the overcoat layer 14 is to be formed, is layered on the overcoat layer 7 (FIG. 16B). A photomask 14d is arranged over the overcoat material layer 14a, the overcoat material layer 14a is exposed to light through the photomask 14d (FIG. 17A), and subsequently the overcoat material layer 14a is developed. As a result of the above process, the overcoat layer 14 can be formed such that the overcoat layer 14 has an opening 14e therein for forming the contact hole (FIG. 17B). The photomask 14d has a light-blocking region 14b in which light-transmittance is low and an aperture region 14c in which light-transmittance is high. In the present modified example, the overcoat layer 14 is made from a photosensitive material of a type such that a region that is unexposed to light is removed during developing, and a region that is exposed to light remains during developing. Therefore, the photomask 14d is arranged such that in plan-view the light-blocking region 14b overlaps with a region of the overcoat material layer 14a in which the opening is to be formed, and the aperture region 14c overlaps with all other regions of the overcoat material layer 14a. Note that the opening 14e in the overcoat layer 14 has a smaller area than the opening 7e in the overcoat layer 7 in plan-view. In other words, as illustrated in FIG. 17B, the opening 14e in the overcoat layer 14 has a diameter D3 which is smaller than the diameter D2 of the opening 7e in the overcoat layer 7. Through the above, the overcoat layer 14 covers an internal side surface of the overcoat layer 7 located around the opening in the overcoat layer 7. Through the structure described above, the bank layer 5 and the overcoat layer 7 are not directly exposed to a gas or liquid chemical that is used in a process step after formation of the overcoat layer 14. Consequently, degradation of the bank layer 5 and the overcoat layer 7 can be restricted, even when the bank layer 5 and the overcoat layer 7 are made of materials that have low tolerances against the aforementioned gas or liquid chemical.

(2) Opening Shape

In the embodiments, explanation was provided under the presumption that the opening in the bank layer 5 and the opening in the overcoat layer 7 have the same shape in plan-view. However, the above is not a limitation, and alternatively the opening in the bank layer 5 and the opening in the overcoat layer 7 may have different shapes in plan-view, so long as a condition is satisfied that the opening in the overcoat layer 7 has a smaller area than the opening in the bank layer 5. The opening in the bank layer 5 and the opening in the overcoat layer 7 may for example each have a quadrilateral, circular, oval, or polygonal shape in plan-view.

(3) Photosensitive Material Type

Figure 18:
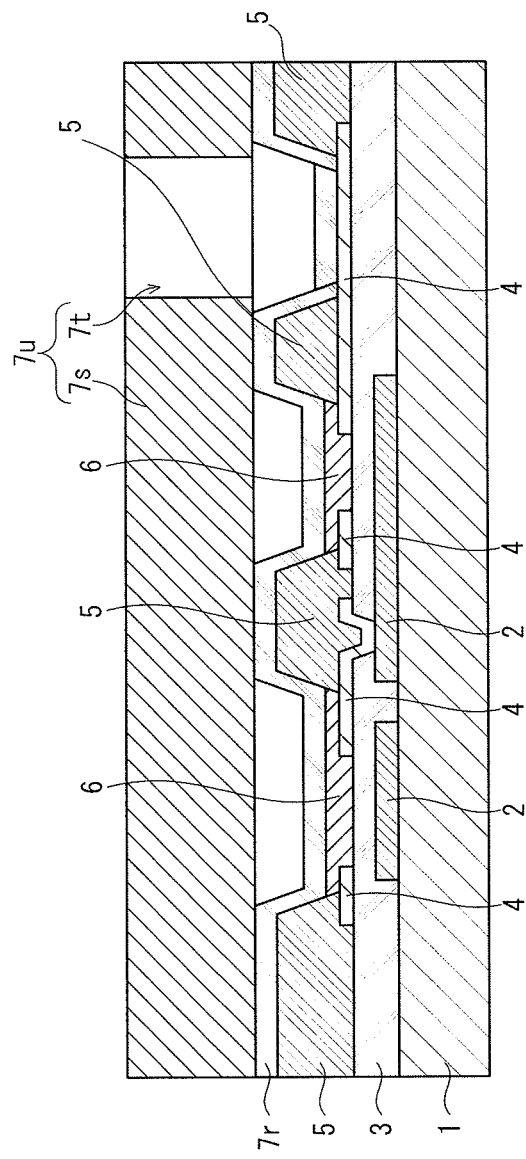
FIG. 18 is a cross-sectional diagram illustrating a production process of a display panel relating to a modified example of the first embodiment of the present disclosure.

In the embodiments, the second layer (i.e., the overcoat layer 7 in the first embodiment and the bank layer 5 in the second embodiment) is formed from a photosensitive material of a type such that a region that is unexposed to light is removed during developing and a region that is exposed to light remains during developing. However, the above is not a limitation, and alternatively the second layer may be formed from a photosensitive material of a different type having properties which are the reverse of the above. If for example the photosensitive material of the different type is used in the first embodiment, as illustrated in FIG. 18, a photomask 7u is arranged over an overcoat material layer 7r such that in plan-view an aperture region 7t of the photomask 7u overlaps with a region of the overcoat material layer 7r in which an opening is to be formed, and a light-blocking region 7s of the photomask 7u overlaps with all other regions of the overcoat material layer 7r. The above similarly applies if the photosensitive material of the different type is used in the second embodiment.

(4) Electrode Size

Figure 19:
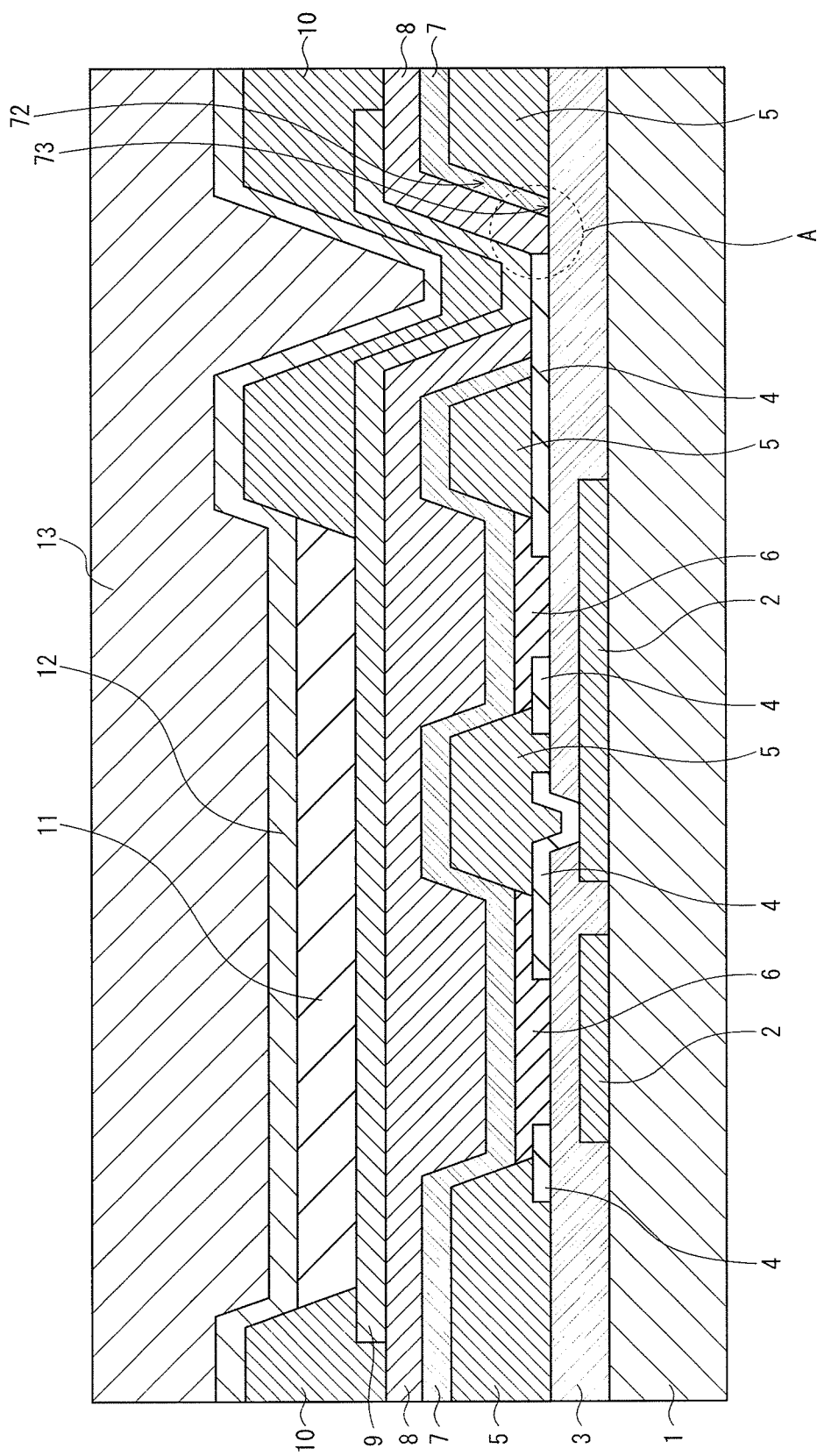
FIG. 19 is a cross-sectional diagram illustrating structure of a display panel relating to a modified example of the first embodiment of the present disclosure.

As illustrated in FIG. 1, in the first embodiment the S-D electrode 4 formed on the base substrate has a larger area than the opening in the bank layer 5. Also, a lower surface 73 of the overcoat layer portion 72, located in the opening, is in contact with an upper surface of the S-D electrode 4 around an entire perimeter of the opening. In contrast to the above, the opening in the bank layer 5 may alternatively have a larger area than a portion of the S-D electrode 4 located in the opening in the bank layer 5, as illustrated in FIG. 19 (refer to region A). In the aforementioned configuration, the lower surface of the overcoat layer portion 72, located in the opening in the bank layer 5, is in contact with an upper surface of the gate insulating film 3. When compared to one another, the respective structures illustrated in FIGS. 1 and 19 have features such as described below. Such features should be considered when determining which of the aforementioned structures to adopt.

In the structure illustrated in FIG. 19, area of the S-D electrode 4 is smaller than in the structure illustrated in FIG. 1. Therefore, parasitic capacitance of the S-D electrode 4, the pixel electrode 9 and the insulating layer therebetween can be reduced, increasing drive responsiveness of the light-emitting element.

On the other hand, compared to the structure illustrated in FIG. 19, area of the S-D electrode 4 is larger in the structure illustrated in FIG. 1. Therefore, in the structure illustrated in FIG. 1 there is a larger allowable range for a shift in position occurring as a result of an alignment error. As a result of the above, equipment used in production of the display panel can be simplified.

A configuration is also possible in which the gate insulating film 3 is made of a highly water repellant material in order to increase grain size of the semiconductor layer portions 6. In the aforementioned configuration, if the structure illustrated in FIG. 19 is adopted, adhesion between the overcoat layer 7 and the gate insulating film 3 may be weakened, and thus a pathway for penetration of a gas or liquid chemical may be formed at an interface between the overcoat layer 7 and the gate insulating film 3. On the other hand, in the structure illustrated in FIG. 1 the overcoat layer 7 is in contact with the S-D electrode 4. Therefore, even if the gate insulating film 3 is made of a highly water repellant material, degradation of the bank layer 5 can still be restricted as a pathway for penetration of the gas or liquid chemical is unlikely to form.

(5) Display Device Application Example

Figure 20:
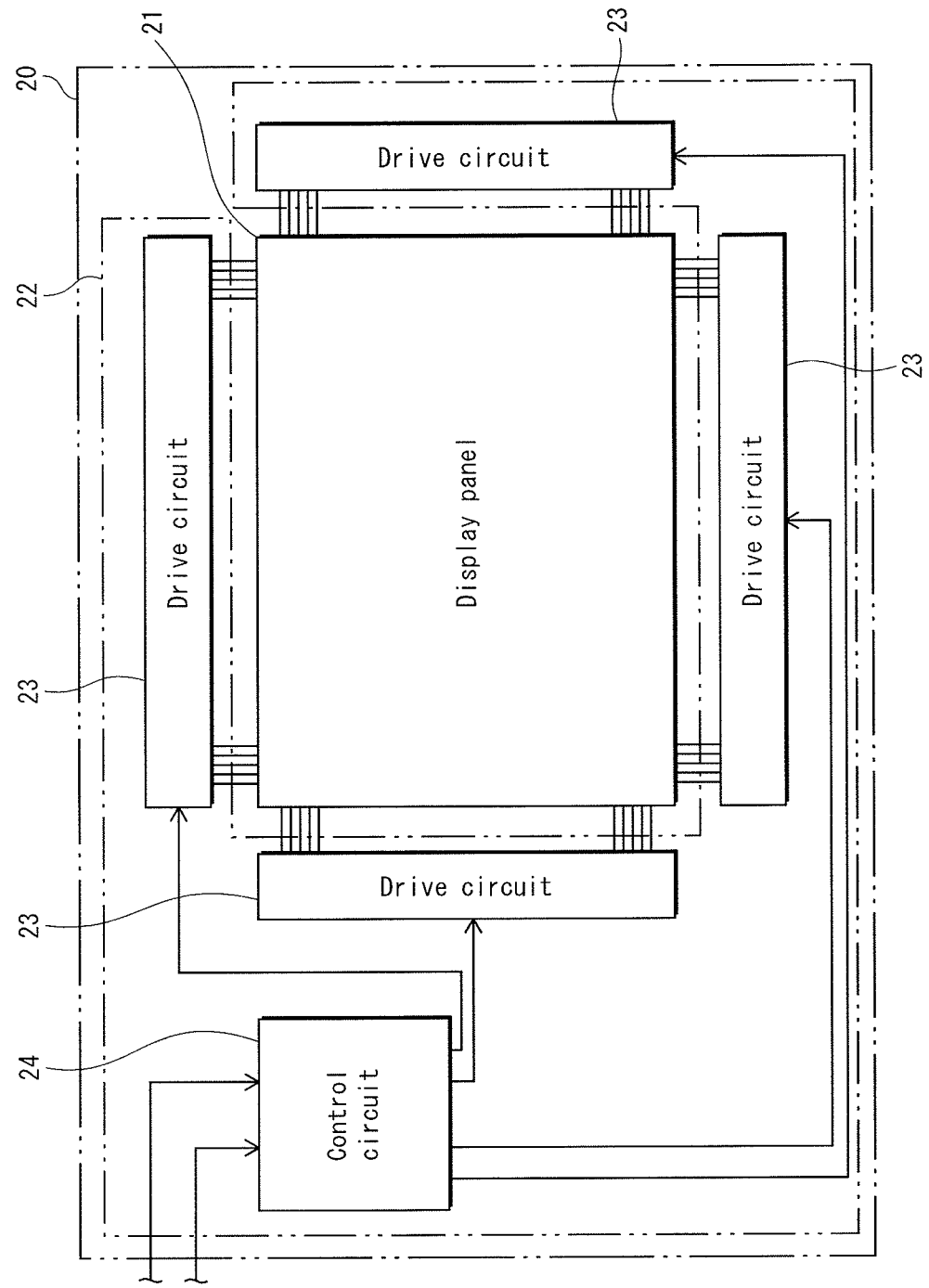
FIG. 20 illustrates functional blocks when the display panel illustrated in FIG. 1 is adopted in a display device.
Figure 21:
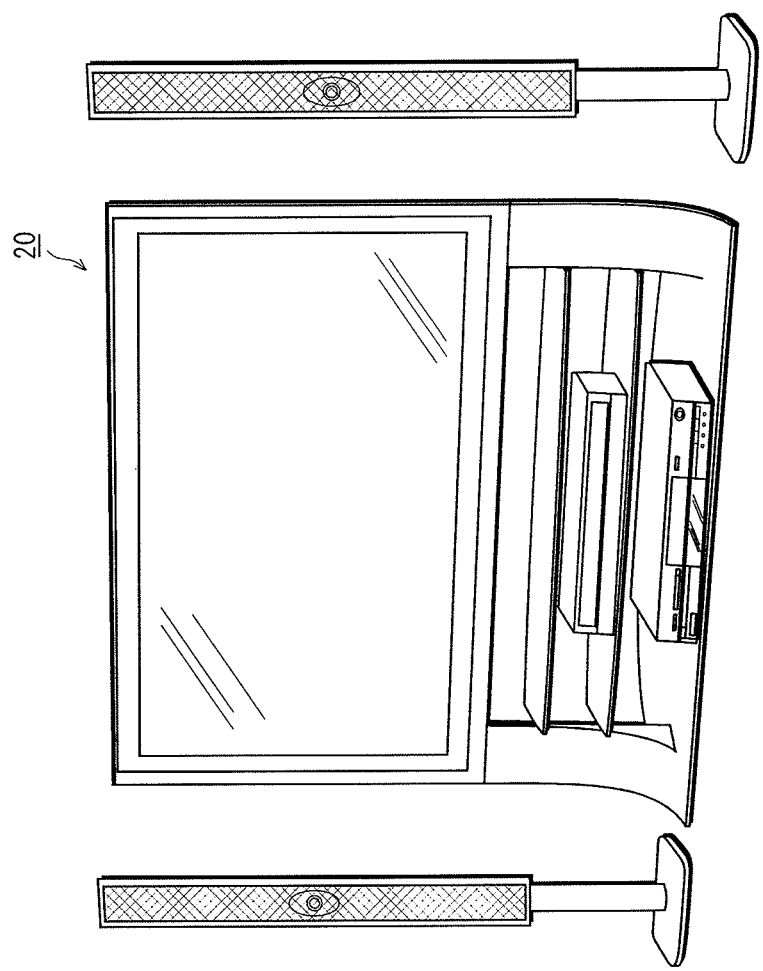
FIG. 21 illustrates an example of external appearance of the display device illustrated in FIG. 20.
Figure 22:
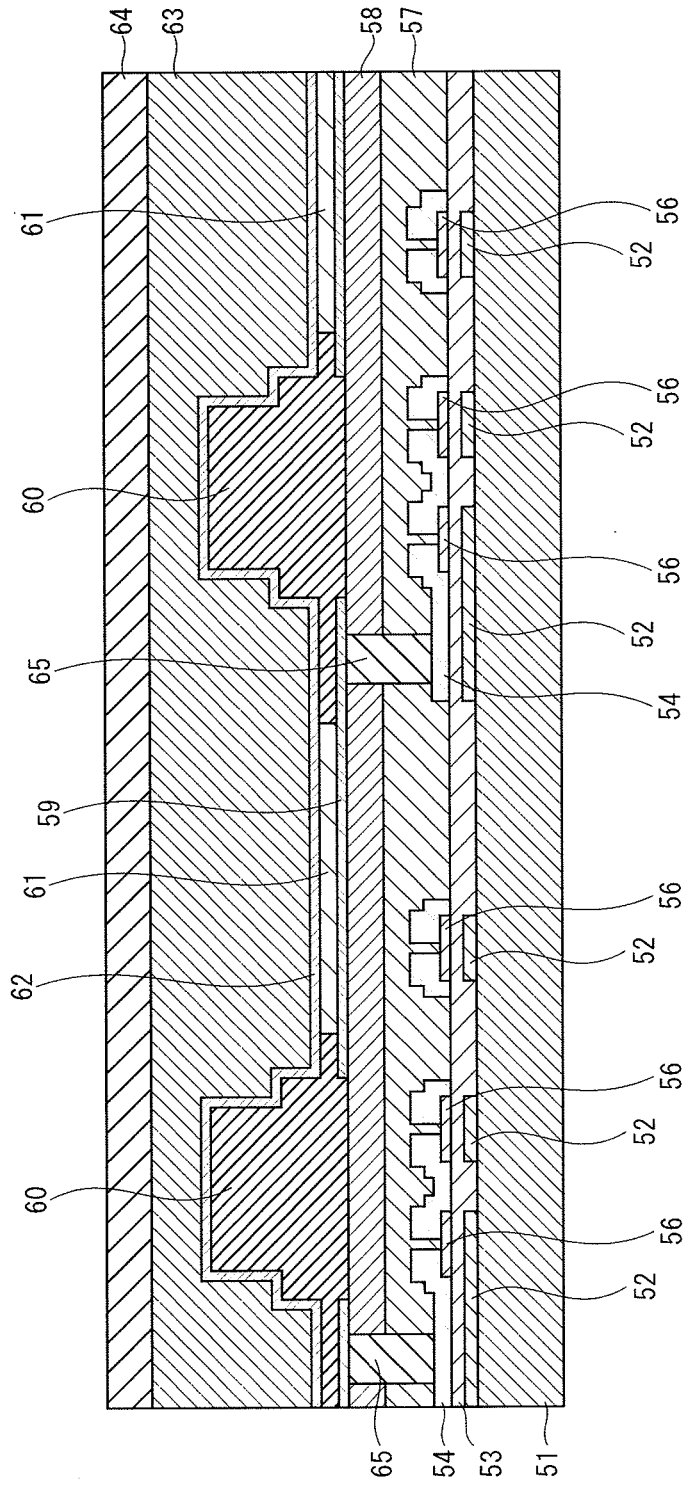
FIG. 22 is a cross-sectional diagram illustrating structure of an organic EL display panel disclosed in Patent Literature 1.

FIG. 20 illustrates functional blocks when the display panel illustrated in FIG. 1 is adopted in a display device. FIG. 21 illustrates an example of external appearance of the display device illustrated in FIG. 20. In FIG. 20 a display device 20 includes a display panel 21 and a drive controller 22 that is electrically connected to the display panel 21. The drive controller 22 includes drive circuits 23 and a control circuit 24 that controls operation of the drive circuits 23.

INDUSTRIAL APPLICABILITY

The present disclosure may be applied to an organic EL display or similar device.

REFERENCE SIGNS LIST 1 substrate
2 gate electrode
3 gate insulating film
3a gate insulating material layer
3b light-blocking region
3c aperture region
4 S-D electrode
4a S-D material layer
4b resist pattern
5 bank layer
5a bank material layer
5b light-blocking region
5c aperture region
5d photomask
6 semiconductor layer portion
7 overcoat layer
7a overcoat material layer
7b light-blocking region
7c aperture region
7d photomask
7r overcoat material layer
7s light-blocking region
7t aperture region
7u photomask
8 planarizing layer
8a planarizing material layer
8b light-blocking region
8c aperture region
8d photomask
8e contact hole
9 pixel electrode
10 bank layer
11 organic EL layer
12 common electrode
13 sealing layer
14 overcoat layer
14a overcoat material layer
14b light-blocking region
14c aperture region
14d photomask
20 display device
21 display panel
22 drive controller
23 drive circuit
24 control circuit
51 substrate
52 gate electrode
53 gate insulating film
54 S-D electrode
56 semiconductor layer portion
57 passivation film
58 planarizing film
59 pixel electrode
60 banks
61 organic EL layer portion
62 common electrode
63 resin sealing layer
64 sealing substrate
65 metal contact

The invention claimed is:

1. A transistor array comprising:
a base substrate;
a gate electrode located on an upper surface of the base substrate;
a gate insulating film located on the base substrate and having a first opening therein at a position overlapping with the gate electrode in plan-view;
a bank layer located on the gate insulating film and having a second opening therein at a position overlapping with the first opening in plan-view, the second opening having a smaller area than the first opening in plan-view; and
a wiring layer located in the first opening and the second opening, in contact with the gate electrode, wherein
the bank layer includes a portion located on an upper surface of the gate insulating film and a portion located in the first opening, and
the portion of the bank layer located in the first opening covers an internal side surface of the gate insulating film located around the first opening.

2. The transistor array of claim 1, wherein
the bank layer has a third opening therein at a different position to the second opening, the third opening being for formation of a functional material layer including at least a semiconductor layer.

3. The transistor array of claim 1, wherein
the wiring layer is a source electrode or a drain electrode.

4. The transistor array of claim 1, wherein
the bank layer has a third opening,
a semiconductor layer is located in the third opening, and
the wiring layer is further located in the third opening, in further contact with a top surface of the semiconductor layer.

5. A display panel comprising:
a base substrate;
a gate electrode located on an upper surface of the base substrate;
a gate insulating film located on the base substrate and having a first opening therein at a position overlapping with the gate electrode in plan-view;
a bank layer located on the gate insulating film and having a second opening therein at a position overlapping with the first opening in plan-view, the second opening having a smaller area than the first opening in plan-view; and
a wiring layer located in the first opening and the second opening, in contact with the gate electrode, wherein
the bank layer includes a portion located on an upper surface of the gate insulating film and a portion located in the first opening, and
the portion of the bank layer located in the first opening covers an internal side surface of the gate insulating film located around the first opening.

6. The display panel of claim 5, wherein
the bank layer has a third opening therein at a different position to the second opening, the third opening being for formation of a functional material layer including at least a semiconductor layer.

7. The display panel of claim 5, wherein
the wiring layer is a source electrode or a drain electrode.

8. The display panel of claim 5, wherein
the bank layer has a third opening,
a semiconductor layer is located in the third opening, and
the wiring layer is further located in the third opening, in further contact with a top surface of the semiconductor layer.

9. A method for producing a transistor array, comprising:
preparing a base substrate having an upper surface on which a gate electrode is located;
forming a gate insulating film on the base substrate such that the gate insulating film has a first opening therein at a position overlapping with the gate electrode in plan-view;
forming a bank layer on the gate insulating film such that the bank layer has a second opening therein at a position overlapping with the first opening in plan-view, the second opening having a smaller area than the first opening in plan-view; and
forming a wiring layer in the first opening and the second opening such that the wiring layer is in contact with the gate electrode, wherein
the bank layer includes a portion located on an upper surface of the gate insulating film and a portion located in the first opening, and
the portion of the bank layer located in the first opening covers an internal side surface of the gate insulating film located around the first opening.

10. The method for producing a transistor array of claim 9, wherein
the first opening has a smaller area than the gate electrode in plan-view, and
a lower surface of the portion of the bank layer in the first opening is in contact with an upper surface of the gate electrode around an entire perimeter of the first opening in plan-view.

11. The method for producing a transistor array of claim 9, wherein
in the forming of the bank layer, the bank layer is formed such that the bank layer has a third opening therein at a different position to the second opening, the third opening being for formation of a functional material layer including at least a semiconductor layer.

12. The method for producing a transistor array of claim 9, wherein
the wiring layer is a source electrode or a drain electrode.

13. The method for producing a transistor array of claim 9, wherein
the bank layer has a greater tolerance than the gate insulating film against a gas or liquid chemical used after the forming of the bank layer.

14. The method for producing a transistor array of claim 9, wherein
the bank layer has a third opening,
a semiconductor layer is formed in the third opening, and
the wiring layer is further formed in the third opening such that the wiring layer is further in contact with a top surface of the semiconductor layer.

15. A method for producing a display panel, comprising:
preparing a base substrate having an upper surface on which a gate electrode is located;
forming a gate insulating film on the base substrate such that the gate insulating film has a first opening therein at a position overlapping with the gate electrode in plan-view;
forming a bank layer on the gate insulating film such that the bank layer has a second opening therein at a position overlapping with the first opening in plan-view, the second opening having a smaller area than the first opening in plan-view; and
forming a wiring layer in the first opening and the second opening such that the wiring layer is in contact with the gate electrode, wherein
the bank layer includes a portion located on an upper surface of the gate insulating film and a portion located in the first opening, and
the portion of the bank layer located in the first opening covers an internal side surface of the gate insulating film located around the first opening.

16. The method for producing a display panel of claim 1, wherein
the first opening has a smaller area than the gate electrode in plan-view, and
a lower surface of the portion of the bank layer in the first opening is in contact with an upper surface of the gate electrode around an entire perimeter of the first opening in plan-view.

17. The method for producing a display panel of claim 1, wherein
in the forming of the bank layer, the bank layer is formed such that the bank layer has a third opening therein at a different position to the second opening, the third opening being for formation of a functional material layer including at least a semiconductor layer.

18. The method for producing a display panel of claim 1, wherein
the wiring layer is a source electrode or a drain electrode.

19. The method for producing a display panel of claim 1, wherein
the bank layer has a greater tolerance than the gate insulating film against a gas or liquid chemical used after the forming of the bank layer.

20. The method for producing a display panel of claim 1, wherein
the bank layer has a third opening,
a semiconductor layer is formed in the third opening, and
the wiring layer is further formed in the third opening such that the wiring layer is further in contact with a top surface of the semiconductor layer.

* * * * *